United States Patent [19]
Tsukakoshi et al.

[11] Patent Number: 5,838,112
[45] Date of Patent: Nov. 17, 1998

[54] PARALLEL SCAN TYPE ION IMPLANTER

[75] Inventors: Osamu Tsukakoshi; Yuzo Sakurada; Kouichi Niikura; Yasuo Mihara, all of Chigasaki, Japan

[73] Assignee: Nihon Shinku Gijutsu Kabushiki Kaisha, Kanagawa-Ken, Japan

[21] Appl. No.: 614,865

[22] Filed: Mar. 13, 1996

Related U.S. Application Data

[63] Continuation-in-part of Ser. No. 340,900, Nov. 15, 1994, abandoned.

[51] Int. Cl.$^6$ ........................................................ H01J 7/24
[52] U.S. Cl. ................................... 315/111.81; 250/423 R
[58] Field of Search ..................... 250/423 R; 315/111.81

[56] References Cited

U.S. PATENT DOCUMENTS 4,870,284  9/1989  Hashimoto et al. ................. 250/423 R

*Primary Examiner*—Robert J. Pascal
*Assistant Examiner*—Michael Shingleton
*Attorney, Agent, or Firm*—Larson & Taylor

[57] ABSTRACT

A parallel scan type ion implanter comprising multipole electrostatic deflectors and designed to produce an even and uniform dose distribution on the entire area of the substrate by maintaining the moving speed of the ion beam spot constant on the substrate is characterized in that it holds the rate of raising or lowering the deflection voltage stepwise along the vertical direction (Y-direction) constant and the manner of varying the rate of changing the deflection voltage along the horizontal direction (X-direction) with time as the function of the location of the moving beam spot on the substrate determined by the dimensional parameters of the multipole electrostatic deflectors assuming that the rate is normalized by the rate of changing the deflecting voltage when the beam spot passes the center of the substrate.

4 Claims, 18 Drawing Sheets

TITLE : IPZ-9000 TEST B 100keV  Dose: 1E14 ions/cm2
  Species: B                    Beam Current: 53.8 μA
  Beam Energy : 100 keV         Operator: NIIK
  Machine : IPZ-9000

|  |  |
|---|---|
| MEAN | : 503.2 ohms/sq |
| STD DEV | : 2.432 percent |
| MINIMUM | : 465.3 ohms/sq |
| MAXIMUM | : 522.2 ohms/sq |
| INTERVAL | : 1.00 percent |
| CURRENT | : AP/D7.47mV |
|  | .0687mA |
| SORTING | : 3.0 SIGMA |

TOTAL SITES : 121
GOOD SITES : 120
WAFER DIV. : 200.00mm/7.87in
TEST DIV. : 180.00mm/7.09in

Rotated    0 deg.
Tilted    30 deg.

Dose: 1E14 ions/cm2
Beam Current: 53.8 μA
Operator: NIIK

TITLE : IPZ-9000 TEST B 100keV
    Species: B
    Beam Energy : 100keV
    Machine : IPZ-9000

TOTAL SITES : 121
GOOD SITES : 120
WAFER DIV. : 200.00mm/7.87in
TEST DIV. : 180.00mm/7.09in

MEAN : 503.2 ohms/sq
STD DEV : 2.432 percent
MINIMUM : 465.3 ohms/sq
MAXIMUM : 522.2 ohms/sq
INTERVAL : 1.00 percent
CURRENT : AP/D7.47mV
 .0687mA
SORTING : 3.0 SIGMA TITLE : IPZ-9000 TEST NB-9-21
　　Species : B
　　Beam Energy : 100keV
　　Machine : IPZ-9000

TOTAL SITES : 121
GOOD SITES : 121
WAFER DIV. : 200.00mm/7.87in
TEST DIV. : 180.00mm/7.09in

Dose: 1E14 ions/cm2
Beam Current: 44 $\mu$A
Operator: NIIK

MEAN　　　: 449.7 ohms/sq
STD DEV　 : 1.490 percent
MINIMUM　 : 437.4 ohms/sq
MAXIMUM　 : 460.0 ohms/sq
INTERVAL　: 0.50 percent
CURRENT　 : AP/D7.49mV
　　　　　　　.0734mA
SORTING　 : 3.0 SIGMA

| | | | |
|---|---|---|---|
| Rotated | 0 deg. | Dose: | 1e14 ions/cm2 |
| Tilted | 30 deg. | Beam Current: | 44 µA |
| | | Operator: | NIIK |

TITLE : IPZ-9000 TEST
　　　　Beam Energy : 100keV
　　　　Machine : IPZ-9000
　　　　Species : B TOTAL SITES : 121
GOOD SITES : 121
WAFER DIV. : 200.00mm/7.87in
TEST DIV. : 180.00mm/7.09in MEAN : 449.7 ohms/sq
STD DEV : 1.490 percent
MINIMUM : 437.4 ohms/sq
MAXIMUM : 460.0 ohms/sq
INTERVAL : 0.50 percent
CURRENT : AP/D7.49mV
　　　　　　0.0734mA
SORTING : 3.0 SIGMA TITLE : IPZ-9000 TEST NB-9-19
Species: B
Beam Energy : 100 keV
Machine : IPZ-9000

Dose: 1E14 ions/cm2
Beam Current: 44 μA
Operator: NIIK

MEAN : 508.6 ohms/sq
STD DEV : .4034 percent
MINIMUM : 503.2 ohms/sq
MAXIMUM : 512.1 ohms/sq
INTERVAL : 0.50 percent
CURRENT : AP/D7.49mV
.0664mA
SORTING : 3.0 SIGMA TOTAL SITES : 121
GOOD SITES : 121
WAFER DIV. : 200.00mm/7.87in
TEST DIV. : 180.00mm/7.09in 0.69%

-1.06%

Rotated     0 deg.
Tilted     30 deg.

FILE : 2663

TITLE : IPZ-9000  TEST  NB-9-19   Dose: 1E14 ions/cm2
       Species:  B               Beam Current: 44 μA
       Beam Energy : 100 keV     Operator: NIIK
       Machine : IPZ-9000

| | | | |
|---|---|---|---|
| TOTAL SITES | : 121 | MEAN | : 508.6 ohms/sq |
| GOOD SITES | : 121 | STD DEV | : .4034 percent |
| WAFER DIV. | : 200.00mm/7.87in | MINIMUM | : 503.2 ohms/sq |
| TEST DIV. | : 180.00mm/7.09in | MAXIMUM | : 512.1 ohms/sq |
| WAFER ID. | : NB- 9-19 | INTERVAL | : 1.00  percent |
| LOT ID. | : 1993-08-09 | CURRENT | : AP/D7.49mV |
| PROC. DATE | : AUG-18-1993 | | .0664mA |
| TEMPERATURE | : .0000C | SORTING | : 3.0 SIGMA |

PARALLEL SCAN TYPE ION IMPLANTER

This is a continuation-in-part of application Ser. No. 08/340,900 Nov. 15, 1994, now abandoned.

BACKGROUND OF THE INVENTION

The present invention relates to a parallel scan type ion implanter to be advantageously used for manufacturing integrated circuits in the electronic industry.

Known parallel type ion implanters having an electrostatic deflector system composed of two multipole electrostatic deflectors include those disclosed in Japanese Patent Kokai Nos. 4-6739, 4-137346, 3-102750 and 1-232652.

FIG. 1 of the accompanying drawings schematically illustrates a typical apparatus of the type under consideration. Referring to FIG. 1, the ion beam C drawn out of an ion source A is refined to produce an ion beam of desired ion species by means of a mass analyzer/ion separator B. Then, the obtained ion beam is accelerated by an acceleration tube D to get to a required energy level, focused by a quadrupole electrostatic lens E and deflected twice by 3.5° to show an offset angle of 7° by a first octapole electrostatic deflector F, the offset direction providing the ultimate optical axis of the apparatus, around which the operation of raster deflection is conducted. The direction of the ion beam is corrected by a second octapole electrostatic deflector G to become parallel to the optical axis before the ion beam is implanted in a wafer H.

Referring now to FIG. 2, in the apparatus, the ion beam is caused to perform a scanning operation within an octagonal area containing the wafer H therein as it is horizontally swung while it is moved stepwise vertically to form a raster and after a raster is done the operation of forming a raster is reciprocated with a vertical shift of scanning lines by a quarter of a step whenever the operation comes to an end at the bottom or the top of the octagonal area. FIG. 3 shows the voltages to be applied to the respective electrodes of the first and second octapole electrostatic deflectors F and G.

While known parallel scan type ion implanters having a multipole electrostatic deflector can implant ions in a wafer always from a same direction over the entire area of the wafer, keeping the direction of the ion beam constantly unchanged relative to the wafer, they do not and cannot specify the speed with which the beam moves on the wafer.

However, it has been proved as a result of a number of studies on the exact tracks of ion beams and with experiment that, as a deflecting electric field is applied to an ion beam in an above described known iono-optical system in such a way that the electric field linearly changes as a function of time, the deflection distance of the beam on the wafer from the centre is not proportional to the intensity of the applied deflecting electric field in the strict sense of the word and therefore the speed of the ion beam spot along the horizontal direction is not kept constant over the wafer and also the distance between adjacent raster stripes is not kept constant all over the wafer.

The effect of the electric field of the peripheral areas of a multipole electrostatic deflector on the ion dose distribution on the wafer can be expressed in iono-optical terms as shown below.

When the electric field for deflecting an ion beam in the X-direction (horizontally) and Y-direction (vertically) is linearly varied as a function of time, point (X, Y) comes to show a dose F(X, Y) expressed by equation (1) below if it is normalized by the dose at the center of the wafer.

$$F(X, Y)=1+\lambda_1 X+\lambda_2 Y+\lambda_3 X^2+\lambda_4 Y^2 \qquad (1)$$

If F(X, Y)=1.01, then equation (1) becomes $$\lambda_3 X^2+\lambda_4 Y^2+\lambda_1 X+\lambda_2 Y=0.01,$$

which expresses an elliptic contour for 101% of the dose at the center of the wafer.

Similarly, elliptic contours of 102%, 103% , . . . of the dose at the center of the wafer can be drawn for F(X, Y)=1.02, 1.03, . . . respectively.

Note that $\lambda_3$ and $\lambda_4$ represent respective positive values and the elliptic dose distribution contours possess common foci in the above iono-optical system. Thus, ions are implanted more densely in the peripheral area than at the center of the wafer, the mean dose deviation all over the wafer being 1.5 to 2% for an 8-inch wafer.

In recent years, however, a rigorous requirement of less than 1% has been demanded for the mean dose deviation in the industry in an attempt to improve the performance of ICs and the yield of IC production. If the deflecting electric field is linearly varied as a function of time according to the conventional manner to form a raster, the beam spot moves more slowly in the peripheral area than at the center of the wafer so that ions are excessively implanted in the peripheral area. In other words, the above requirement can be translated into terms of an equal and identical speed for the moving beam spot on the entire area of the wafer and a rate of change in the intensity of the deflecting electric field applied to the ion beam that is variable as a function of the location of the moving beam spot as well as a technique for controlling the operation of forming a raster by means of an ion beam.

It is, therefore, an object of the present invention to provide a parallel scan type ion implanter that can solve the above identified problems and ensures an even distribution of ion dose over the entire area of the wafer.

SUMMARY OF THE INVENTION

According to a first aspect of the invention, the above object is achieved by providing a parallel scan type ion implanter designed to operate to analyze and sort out a pure ion beam from the beam drawn out of an ion source, including means for producing a focused ion beam, a first multipole electrostatic deflector into which the focused ion beam is introduced with an incident angle equal to a half of a given offset deflection angle relative to the central axis of the deflector, said first multipole electrostatic deflector being intended for offsetwise deflecting the ion beam further by an angle substantially equal to a half of the given offset deflection angle relative to the central axis of the first multipole electrostatic deflector and for rasterwise deflecting the ion beam around the axis of the offsetwise deflected ion beam, and a second multipole electrostatic deflector having a configuration geometrically similar to that of the first multipole electrostatic deflector, in which the ion beam is rasterwise deflected back in order to sweep the ion beam and make it strike a substrate always with a same and identical incident angle, wherein if the rate of changing the deflection voltage stepwise along the vertical direction (Y-direction) of the substrate and the rate of changing the deflection voltage along the horizontal direction (X-direction) of the substrate are constant and a dose is equal to 1 when the beam spot passes the center of the substrate, a dose distribution on the substrate is defined by a dose function, $$D(X, Y)=1+\lambda_1 X+\lambda_2 Y+\lambda_3 X^2+\lambda_4 Y^2,$$

where $\lambda_1=0$, $$\lambda_2 = \tan\alpha \frac{3 + \frac{3((L_2/2)+L_D)}{(L_1/2)+L+(L_2/2)}}{(L_1/2)+L+(L_2/2)},$$

$$\lambda_3 = \frac{4((L_2/2)L_D)}{((L_1/2)+L+(L_2/2))^3 \cos^2\alpha},$$

$$\lambda_4 = \frac{4((L_2/2)+L_D)}{((L_1/2)+L+(L_2/2))^3},$$

$L_1$ and $L_2$ are respectively the length of said first multipole electrostatic deflector and that of the second multipole electrostatic deflector, $L_D$ is the distance between the center of the outlet port of the second multipole electrostatic deflector and the substrate, and L is the distance between the first and second multipole electrostatic deflectors, and wherein said $L_1$, $L_2$, $L_D$ and L are determined so that the constant C of a variation in the dose distribution obtained from said dose function D(X, Y) and defined by the following equation is less than four times as large as that in a final dose distribution which is to be obtained by a digital scanning which is intended, $$C = \frac{\sqrt{[(1/4(\lambda_1^2 + \lambda_2^2) + 1/16((\lambda_3^2 + \lambda_4^2) - 1/24(\lambda_3 \times \lambda_4))r_1^2]} \times r_1}{(1 + 1/4(\lambda_3 + \lambda_4)r_1^2)}$$

where $r_1$ is an outer diameter of the substrate.

According to a second aspect of the invention, there is provided a parallel scan type ion implanter comprising a memory device for storing data on the manner of varying the rate of changing a rastering voltage, a D/A converter for converting a set of data on the rate of changing the rastering voltage into an analog signal voltage, a voltage/frequency converter for converting the analog signal into a frequency signal, an up-down counter for counting the number of frequency signals obtained by the voltage/frequency converter and producing data corresponding to normal coordinates and a device for generating signal source voltages to be respectively applied to the first and second multipole electrostatic deflectors on the basis of the data corresponding to normal coordinates.

In a parallel scan type ion implanter according to the invention, the first and second multipole electrostatic deflectors are designed to show geometrically similar configurations so that same raster voltages are applied respectively to the corresponding electrodes of the first and second multipole electrostatic deflectors (for example, deflection voltages (U', –U', V', –V', $1/\sqrt{2}\cdot$(U'+V'), . . . same as the raster voltages (U, –U, V, –V,$1/\sqrt{1}$ 2·(U+V), . . . obtained by subtracting respectively the offset voltages (Vo, or –Vo, Vo/$\sqrt{2}$, –Vo/$\sqrt{1}$ 2, . . . from the voltages applied to the respective electrodes of the first octapole electrostatic deflector are applied to the corresponding electrodes, where U=U' and V=V').

When the rate of raising or lowering the deflection voltage stepwise along the vertical direction (Y-direction) of the substrate is made constant and the ratio of the rate of changing the deflection voltage along the horizontal direction (X-direction) of the substrate corresponding to the beam spot position on the substrate (X, Y) to that of changing the deflecting voltage corresponding to the beam spot portion at the center of the substrate is adjusted according to the value of the above defined equation, so that the speed with which the beam spot moves on the substrate to form a raster is always held to a uniform level to produce a highly even distribution of dose.

Now, the present invention will be described by referring to FIGS. 4 through 11 of the accompanying drawings that illustrate a preferred embodiment of the invention.

DETAILED DESCRIPTION OF THE PREFERRED EMBODIMENT

Figure 4:
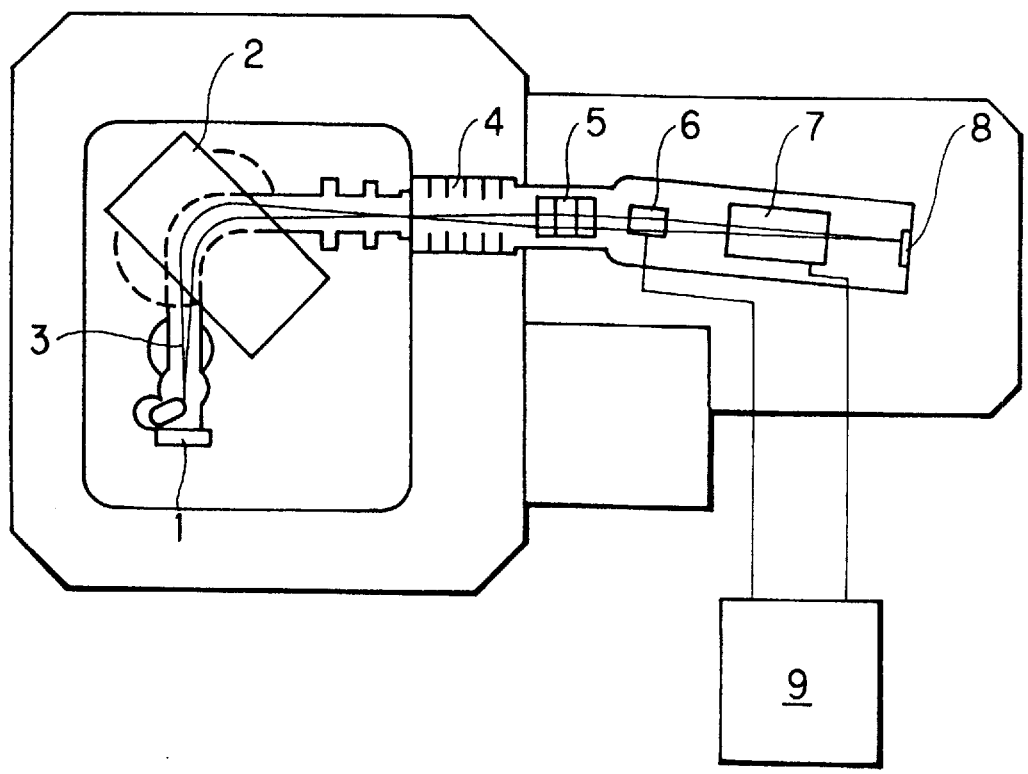
FIG. 4 is a schematic side view a preferred embodiment of the invention, schematically showing the configuration thereof.

Referring to FIG. 4, there is shown an ion implanter according to a preferred embodiment of the invention. The illustrated ion implanter comprises an ion source 1 for generating an ion beam, a mass analyzer/ion separator 2 for refining the ion beam 3 drawn out of the ion source 1 to produce an ion beam 3 of a specific element having same mass number (e.g., arsenic, phosphorus, boron), an accelerator 4 for accelerating the ion beam 3 refined by the mass analyzer/ion separator 2, a focusing lens 5 for focusing the accelerated ion beam 3, a first multipole electrostatic deflector 6 for offsetwise deflecting the focused ion beam 3 by a given angle, for example 7° and rasterwise deflecting it in the horizontal direction (X-direction) and in the vertical direction (Y-direction) simultaneously, said deflector having a central axis inclined approximately by an angle of a half of the angle of offset deflection (e.g., 3.5°) relative to the incident ion beam, and a second multipole electrostatic deflector 7 having a configuration geometrically similar to that of the first multipole electrostatic deflector 6 and arranged on the axis of the ion beam 3 that has been offsetwise deflected to rasterwise deflecting back the rasterwise deflected ion beam 3 in the horizontal direction (X-direction) and in the vertical direction (Y-direction) simultaneously so that the ion beam 3 strikes a substrate 8 always with a same and identical incident angle. Reference numeral 9 in FIG. 4 denotes a control unit designed to digitally control the raster voltages to be applied to the first and second multipole electrostatic deflectors 6 and 7 respectively in such a way that the substrate 8 shows an even distribution of ion dose over its entire area.

The control unit 9 is so designed that, if the length of the first multipole electrostatic deflector 6 and that of the second multipole electrostatic deflector 7 are respectively $L_1$ and $L_2$ and the distance between the center of the exit of the second multipole electrostatic deflector and the substrate is $L_D$, the first and second multipole electrostatic deflectors 6 and 7 being separated by a distance of L, the raster voltages to be applied to the first and second multipole electrostatic deflectors are digitally controlled in such a way that the speed with which the rastering electric field to the horizontal direction changes when the beam spot moves at point (X, Y) on the substrate is proportional to F(X, Y) defined by the equation below:

$$F(X, Y)=1+\lambda_1 X+\lambda_2 Y+\lambda_3 X^2+\lambda_4 Y^2,$$

where $\lambda_1=0$, $$\lambda_2 = \tan\alpha \frac{3 + \frac{3((L_2/2)+L_D)}{(L_1/2)+L+(L_2/2)}}{(L_1/2)+L+(L_2/2)}, \quad (1)$$

$$\lambda_3 = \frac{4((L_2/2)+L_D)}{((L_1/2)+L+(L_2/2))^3 \cos^2\alpha},$$

and $$\lambda_4 = \frac{4((L_2/2)+L_D)}{((L_1/2)+L+(L_2/2))^3}.$$

The above relation can be iono-optically established and experimentally proved. This will be described below in detail.

Figure 5:
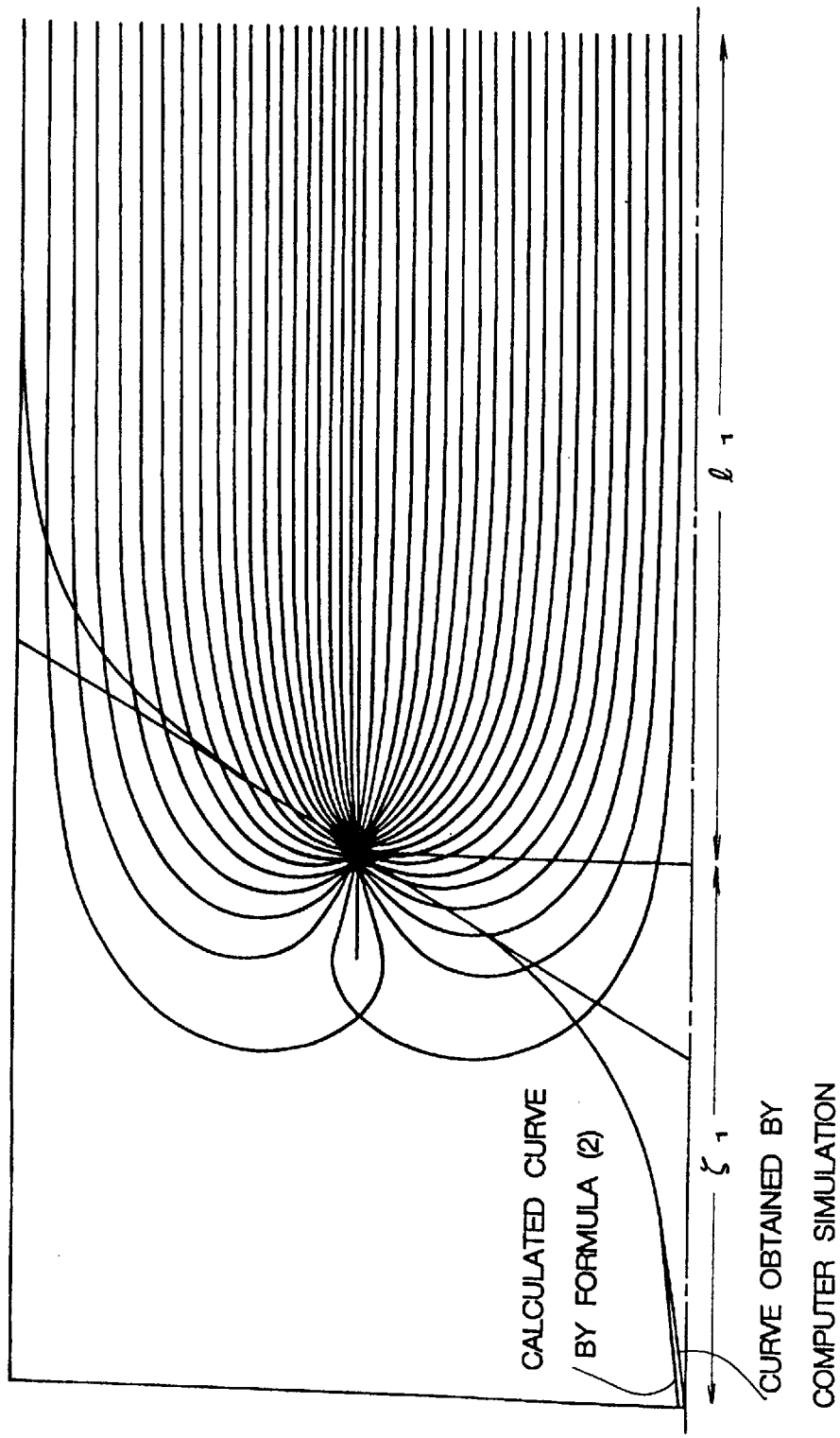
FIG. 5 is a graph showing the distribution of electric potential within an ideal multipole electrostatic deflector obtained by simulation using a finite element method.

(A) An iono-optical analysis of the dose distribution on the substrate produced by the parallel scan operation of a multipole electrostatic deflector:
(1) The distribution of electric field within the multipole deflector FIG. 5 is a graph showing the distribution of electric potential within an ideal multipole electrostatic deflector obtained by simulation using a finite-element method. It shows the distribution of electric potential within an ideal multipole electrostatic deflector housed in a vacuum container along with the standardized distribution of electric field along the central axis in the inlet side half of the deflector. The distribution of electric field along the central axis of the multipole electrostatic deflector can be expressed accurately by equation (2) below, where the coordinate system originates from the middle point of the central axis of the multipole electrostatic deflector.

$$E=E_0 \cdot 1/(\exp(-\beta_1(z+l_1))+1) \quad (2)$$

Assume that a 10 mm gap is provided at each of the opposite ends of an ideal multipole electrostatic deflector having a diameter of 150 mm and a length of 350 mm and a guard ring having a diameter of 150 mm and a length of 20 mm is arranged for grounding. Then, the relations $\beta_1=0.0459$ mm$^{-1}$ and $l_1=180.475$ mm will be obtained. FIG. 5 shows in comparison the result of a calculation using these values in the equation (2) and that by a computer simulation.

The result of the calculation using the relation (2) differs by only about 0.4% of the full scale at and near the inlet port of the multipole from that of the simuating operation. Otherwise, they agree with each other quite well with an error level of 0.1%.

The distribution of electric field on the right side of the multipole electrostatic deflector can be approximately expressed by a following equation.

$$E=E_0 \cdot 1/(\exp(\beta_1(z-l_1))+1) \quad (3)$$

Figure 6:
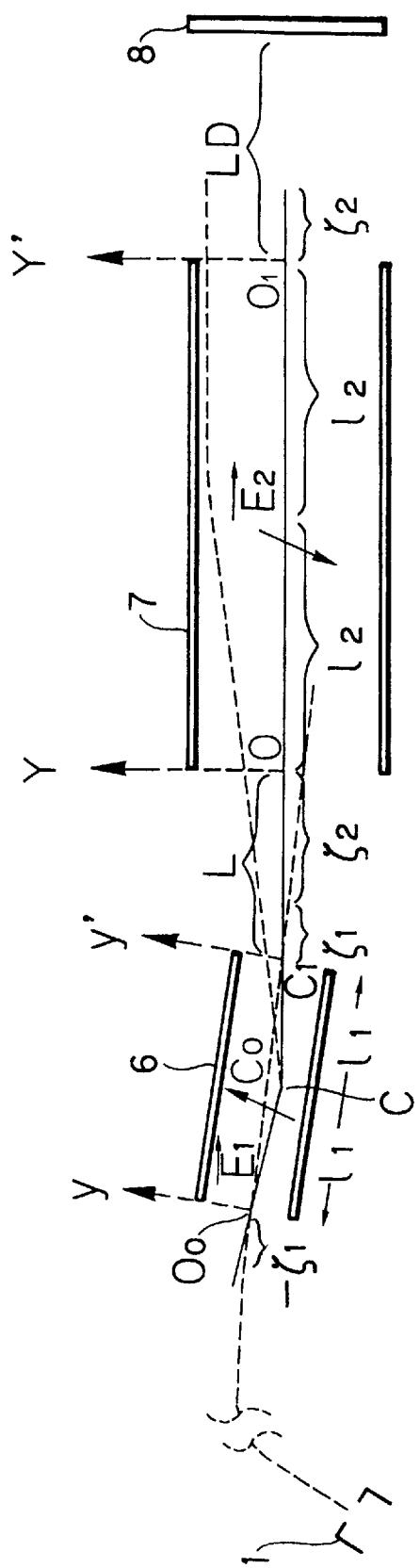
FIG. 6 is a schematic side view of the embodiment of FIG. 4, showing the track of ions in the first and second multipole electrostatic deflectors thereof.

To proceed further with the analysis, it is assumed here that the above approximation for the distribution of electric field applies to areas considerably remote from the axis as well as to areas not far from the axis.
(2) The track of ions in the first multipole electrostatic deflector Consider a deflection system as shown in FIG. 6 for parallel scan deflection using a multipole electrostatic deflector.

The ion beam is made to hit the center $O_0$ of the inlet port, or the plane of incidence, that is distanced by $|l_1|$ from the middle point of the central axis of the first multipole electrostatic deflector 6 along a direction inclined by an angle of $\alpha$ (3.5°) from the central axis and, if not subjected to raster deflection, proceed toward the center $C_1$ of the outlet port of the multipole electrostatic deflector that is separated from the middle point of the central axis of the deflector by $|l_1|$ along a direction (on the line connecting C, $C_1$ and O) inclined by an angle of $\alpha$ from the central axis or by an angle of $2\alpha$ (7°) from the direction of the incident ion beam so that the line connecting C, $C_1$ and O provides a new optical axis after the offset deflection by the first deflector. The second electrostatic deflector 7 is arranged in such a way that its central axis agrees with the new optical axis. The first multipole electrostatic deflector 6 is so operated as to offsetwise deflect the incident beam by 7° to the direction of the line $CC_1O$ and rasterwise deflect the beam around the line $CC_1O$, whereas appropriate voltages are applied to the respective electrodes of the first and second multipole electrostatic deflectors 6 and 7 to generate an electric field and deflect back the rasterwise deflected beam so that the ion beam leaving the second multipole electrostatic deflector 7 is constantly held in parallel with the optical axis. The above described overall operation of the deflection system is realized by designing it on the basis of the principle of geometrical similarity.

To analyze the course of the ion beam within the first multipole electrostatic deflector 6, let us shift the original point of the coordinate system by $l_1$ negatively to point $O_0$ for the inlet side of the deflector so that the relation below holds true on that side.

$$E(z)=E_0/(\exp(-\beta_1 z)+1) \quad (4)$$

Likewise, shift the original point of the coordinate system by $l_1$ positively to point $C_1$ for the outlet side of the deflector so that the relation below also holds true on the latter side.

$$E(z')=E_0/(\exp(\beta_1 z')+1) \quad (5)$$

Now, the inlet side half portion of the ion beam will be analyzed.

Figure 7:
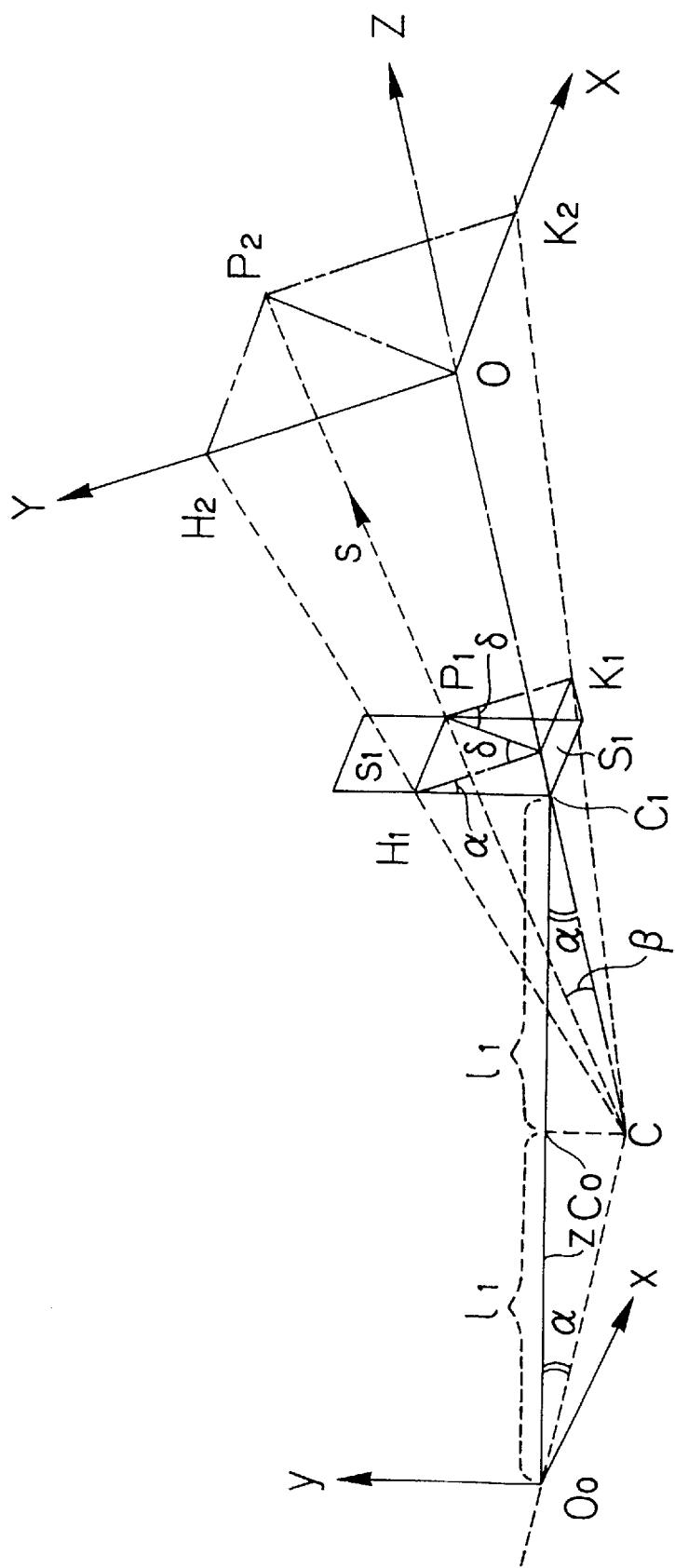
FIG. 7 is a schematic perspective view of the embodiment of FIG. 4, showing three-dimensionally the track of ions in the first and second multipole electrostatic deflectors thereof.

Assume a rectangular coordinate system $O_0$–xyz originating from point $O_0$ and the incident ion beam to the first deflector is designed to aim at the point $O_0$ on yz plane with an angle of $\alpha$ relative to the z-axis. In other words, the ion beam enters the deflector along line $O_0$ C, where the point C is distanced from the middle point $C_0$ of the central axis of the first multipole electrostatic deflector 6 by $l_1 \tan \alpha$ in the direction of $-y$. Then, the ion beam starts being deflected from the point of incidence $z=-\zeta_1$ (here $\zeta_1$=119.525 mm), where the deflecting electric field rises from zero (FIGS. 5, 6 and 7). If the electric potential at the plasma meniscus of the ion source from which the ion beam originates is $\Phi_{init}$ and the electric charge and the mass of each ion are e and m respectively, while the initial velocity of the ion at the point of incidence is $v_0$, the following relation is established in view of the fact that the electric potential is zero at the point of incidence.

$$\tfrac{1}{2} \cdot m v_0^2 = e \Phi_{init}$$

If the z-component of the initial velocity at the point of incidence is expressed by $v_{z0}$, the relation below always holds true in the first multipole electrostatic deflector 6 because the deflecting electric field is perpendicular to the z-axis.

$$v_{z0} = v_0 \cdot \cos\alpha = \cos\alpha \cdot \sqrt{(2e\phi_{init}/m)}$$

Thus, $$z = -\zeta_1 + v_{z0} \cdot t,$$

$$t = (z+\zeta_1)/v_{z0}$$

and therefore $$dt/dz = 1/v_{z0}.$$

If the y-component of the deflecting electric field is expressed by Ey(z), the equation of motion below is obtained for the y-direction.

$$m \cdot d y^2/dt^2 = e E_y(z) \quad (6)$$

Thus, if the y-component of the velocity is $v_{y0}$ at the point of incidence, the following relations are established.

$$v_{y0} = -v_0 \sin\alpha$$

$$dy/dt = v_{y0} + e/m \cdot \int E_y(z) dt$$

$$y = y_0 + v_{y0} t + e/m \cdot \iint E_y dt^2$$

Since $t=0$ and $y = y_0 = l_1 \tan \alpha$ at the point of incidence, the following equations can be obtained.

$$\int E_y(z)dt = \int E_y(z) \cdot dt/dz \cdot dz = \int E_y(z)dz/v_{z0}$$

$$\iint E_y(z)dt^2 = \iint E_y(z)dz^2/v_{z0}^2$$

Thus, the relation below holds true.

$$e/m \cdot \iint E_y(z)dt^2 =$$

$$\frac{e/m}{2e/m \cdot \cos^2\alpha \cdot \phi_{init}} \cdot \iint E_y(z)dz^2 = \frac{\iint E_y(z)dz^2}{2\cos^2\alpha \cdot \phi_{init}}$$

$$v_{y0} t = -v_0 \sin\alpha(z+\zeta_1)/(v_0 \cos\alpha) = -\tan\alpha(z+\zeta_1)$$

Consequently, the following relations can be estabished.

$$y = -\tan\alpha \cdot z + \frac{1}{2\cos^2\alpha \cdot \phi_{init}} \cdot \int_{-\zeta_1}^{z} \int_{-\zeta_1}^{z} E_y(z)dz^2 \quad (7)$$

$$E_y(z) = E_{y0}/(\exp(-\beta_1 z)+1)$$

$$(2)\text{-}i$$

If the ion beam is not subjected to raster operation, it is necessary to determine a deflecting electric field $E_y$ offset required to deflect the ion beam heading for the center $O_0$ of the inlet port with an angle of $\alpha$ relative to the central axis of the deflector in a manner as illustrated in FIG. 6 such that it may exit the deflector through the center C1 of the outlet port. If, on the other hand, the ion beam is subjected to raster operation, an electric field obtained by adding an electric field required for raster deflection to the above electric field for offset deflection is applied to the beam.

If $E_y$ $_{offset}$ $(z)=E_{y0}$ $_{offset}/(\exp(-\beta_1 z)+1)$ and only this deflection voltage is used, the electric field is symmetric relative to a cross section passing through the middle point of the central axis of the first multipole electrostatic deflector when the tangential line of the ion track runs in parallel with the z-axis on the cross section passing the centre of the deflector as illustrated in FIG. 6 so that the ion beam heads for the center $C_1$ of the output port.

From the equation (7), the following relations can be drawn.

$$dy/dz = -\tan\alpha + \frac{E_{y0offset}}{2\cos^2\alpha \cdot \phi_{init}} \cdot \int_{-\zeta_1}^{z} (\exp(-\beta_1 z)+1)dz =$$

$$-\tan\alpha + \frac{E_{y0offset}}{2\cos^2\alpha \cdot \phi_{init}} \; [z+\zeta_1 + 1/\beta_1 \cdot \log(1+\exp(-\beta_1 z))]_{-\zeta_1}^{z}] -$$

$$\frac{1}{\beta_1} \log(1+\exp(\beta_1 \zeta_1)) = -\frac{1}{\beta_1} \log(\exp(\beta_1 \zeta_1)(\exp(-\beta_1 \zeta_1)+1)) =$$

$$-\zeta_1 - \frac{1}{\beta_1} \log(\exp(-\beta_1 \zeta_1)+1)$$

In order for the ion beam to be in parallel with the z-axis at the cross section passing through the centre of the deflector, a relation of dy/dz=0 is sufficient if $z=l_1$. Thus, $$0 = -\tan\alpha + \frac{E_{y0offset}}{2\cos^2\alpha \cdot \phi_{init}} \left[ l_1 + 1/\beta_1 \cdot \log \frac{1+\exp(-\beta_1 l_1)}{1+\exp(-\beta_1 \zeta_1)} \right]$$

$$1/\beta_1 \cdot \log \frac{1+\exp(-\beta_1 l_1)}{1+\exp(-\beta_1 \zeta_1)} = -0.0846 \text{ mm} \ll l_1$$

and then $$E_{y0 \; offset} = 2 \cdot \sin\alpha \cdot \cos\alpha \cdot \phi_{init}/l_1, \quad (8)$$

proving that voltages should be applied to the respective electrodes of the first multipole electrostatic deflector 6 in such a way that the electric field at the middle point of the central axis of the deflector is equal to $E_{y0 \; offset}$ in the y-direction.

(2)-ii The direction and magnitude of deflection when both the electric field for offset deflection and the electric field for raster deflection are involved
a) Deflection along the y-direction The track of the ion beam exposed to the electric field for offset deflection $E_{y0\ offset}$ and the y-component of the electric field for raster deflection $E_{1y0}$ is as follows.

a-1) The track of the ion beam in the inlet side half portion of the first multipole electrostatic deflector As in the case of (2)-i, $$dy/dz = -\tan\alpha + \frac{E_{y0offset} + E_{1y0}}{2\cos^2\alpha \cdot \phi_{init}} \left( z + 1/\beta_1 \cdot \log\frac{1 + \exp(-\beta_1 z)}{1 + \exp(-\beta_1 \zeta_1)} \cdot \right)$$

By integrating the above equation as in the case of the equation (7) above, the relation shown below is obtained.

$$y = -\tan\alpha \cdot z + \frac{E_{y0offset} + E_{1y0}}{2\cos^2\alpha \cdot \phi_{init}} \cdot \left\{ \frac{z^2 - \zeta_1^2}{2} + \frac{1}{\beta_1} \cdot \right.$$

$$\left. (\int_{-\zeta_1}^{z} \log(1 + \exp(-\beta_1 z))dz - \int_{-\zeta_1}^{z} \log(1 + \exp(-\beta_1 \zeta_1)) \cdot dz \right\}$$

Thus, for the middle point of the central axis of the deflector, the relation below is established as in the case of (2)-i) if $z=l_1$.

$$1/\beta_1 \cdot \log\frac{1 + \exp(-\beta_1 l_1)}{1 + \exp(-\beta_1 \zeta_1)} \ll l_1$$

From equation (9), there is obtained the following equation:

$$(dy/dz)_{z=l_1} = E_{1y0} l_1/2 \cos^2\alpha \cdot \phi_{init} = (dy/dz)_{centre} \quad (10)$$

Now, let us calculate $y_{z=l_1}$, assuming $$I = \int_{-\zeta_1}^{l_1} \log\left( 1 + \exp(-\beta_1 z)dz = \right.$$

$$\int_{0}^{l_1} \log\left( 1 + \exp(-\beta_1 z)dz + \int_{-\zeta_1}^{0} \log(1 + \exp(-\beta_1 z))dz = I_1 + I_2.$$

If $\exp(-\beta_1 z)=\lambda$, $$-\beta_1 \exp(-\beta_1 z)dz = d\lambda$$

and therefore $$dz = -1/\beta_1 \cdot d\lambda/\lambda.$$

Since $z=0: \lambda=1, z=l_1: \lambda=2.526 \times 10^{-4} \approx 0$, $$I_1 = -\frac{1}{\beta_1} \int_{1}^{0} \frac{\log(1 + \lambda)}{\lambda} \, d\lambda = -$$

$$\frac{1}{\beta_1} \int_{1}^{0} \frac{(\lambda - 1/2 \cdot \lambda^2 + 1/3 \cdot \lambda^3 - \ldots + (-1)^{n-1}/n \cdot \lambda^n + \ldots)}{\lambda} \, d\lambda -$$

$$\int_{1}^{0} = (\lambda - \lambda^2/2^2 + \lambda^3/3^2 - \ldots + (-1)^{n-1}\lambda^n/n^2 + \ldots)]_0^1 =$$

-continued $$\Sigma(1 - 1/2^2 + 1/3^2 - \ldots + (-1)^{n-1}/n^2 + \ldots) = \frac{2^{2k-1} - 1}{(2k)!} \cdot$$

$$B_k \pi^{2k}]_{k=1} = 1/2 \cdot 1/6 \cdot \pi^2,$$

where $B_k$ is a Bernoulli's number.

Similarly, $$I_2 = \int_{-\zeta_1}^{0} \log(\exp(-\beta_1 z)(1 + \exp(\beta_1 z)))dz = \quad (11)$$

$$\int_{-\zeta_1}^{0} (-\beta_1 z)dz + \int_{-\zeta_1}^{0} \log(1 + \exp(\beta_1 z))dz =$$

$$\beta_1 \zeta_1^2/2 + \frac{1}{\beta_1} \int_{0}^{1} \frac{\log(1+\lambda)}{\lambda} \, d\lambda 1/\beta_1 \cdot I_2 =$$

$$\zeta_1^2/2 + \pi^2/6\beta_1^2$$

and $$y_{l1} = -\tan\alpha \cdot l_1 + \frac{E_{y0offset} + E_{1yo}}{2\cos^2\alpha \cdot \phi_{init}} (l_1^2/2 + \pi^2/6\beta_1^2) = \quad (12)$$

$$-l_1\tan\alpha/2 + \tan\alpha \cdot \pi^2/6\beta_1^2 l_1 + \frac{E_{1yo}}{2\cos^2\alpha \cdot \phi_{init}} \cdot$$

$$(l_1^2/2 + \pi^2/6\beta_1^2) = y_{centre}.$$

a-2) The track of the ion beam in the outlet side half portion of the first multipole electrostatic deflector 6:

If the origin of the coordinate system is shifted on the z-axis by $l_1$ toward the outlet port from the middle point of the center line of the multipole electrostatic deflector to make the new original point agree with point $C_1$ as illustrated in FIG. 6, the following relations are established for the y-direction.

$$E_y(z) = \frac{E_{y0offset} + E_{1yo}}{(\exp(\beta_1 z) + 1)} \quad d^2y/dz^2 = d^2y/dt^2 \cdot (dt/dz)^2 =$$

$$\frac{E_y(z)}{2\cos^2\alpha \cdot \phi_{init}} \, dy/dz = (dy/dz)_{centre} +$$

$$\frac{E_{y0offset} + E_{1yo}}{2\cos^2\alpha \cdot \phi_{init}} \int_{-l_1}^{z} \frac{1}{\exp(\beta_1 z) + 1} \, dz$$

If we put $\exp(\beta_1 z) = \lambda$ then, $$\beta_1 \cdot \exp(\beta_1 z)dz = d\lambda, \quad dz = d\lambda/\beta_1 \lambda$$

and therefore at the outlet port $z=\zeta_1$, $$\int_{-l_1}^{\zeta_1} \frac{dz}{\exp(\beta_1 z) + 1} = \frac{1}{\beta_1} \int \frac{d\lambda}{\lambda(\lambda + 1)} =$$

$$\frac{1}{\beta_1} \int \left( \frac{1}{\lambda} - \frac{1}{1+\lambda} \right) d\lambda = \frac{1}{\beta_1} \cdot (\beta_1 z - \log(1 + \lambda)) \Big]_{-l_1}^{\zeta_1} =$$

$$\zeta_1 + l_1 - \frac{1}{\beta_1} \log\frac{1 + \exp(\beta_1 \zeta_1)}{1 + \exp(-\beta_1 l_1)} = l_1 + \frac{1}{\beta_1} \cdot$$

$$\log\frac{1 + \exp(-\beta_1 l_1)}{1 + \exp(-\beta_1 \zeta_1)} (dy/dz)_{centre} = \frac{E_{y0offset}}{2\cos^2\alpha \cdot \phi_{init}} \cdot$$

$$\frac{1}{\beta_1} \log\frac{1 + \exp(-\beta_1 l_1)}{1 + \exp(-\beta_1 \zeta_1)} +$$

-continued $$\frac{E_{1yo}}{2\cos^2\alpha \cdot \phi_{init}} \left( l_1 + \frac{1}{\beta_1} \log \frac{1+\exp(-\beta_1 l_1)}{1+\exp(-\beta_1 \zeta_1)} \right) - \frac{1}{\beta_1} \log \frac{1+\exp(-\beta_1 l_1)}{1+\exp(-\beta_1 \zeta_1)} =$$

$$0.0846 \text{ mm} \ll l_1$$

Thus, at the outlet port of the first multipole electrostatic deflector 6, $$(dy/dz)_{z=\zeta_1} = \tan\alpha + \frac{E_{1yo}l_1}{\cos^2\alpha \cdot \phi_{init}} \quad (13)$$

and $$dy/dz = (dy/dz)_{centre} + \frac{E_{yOoffset} + E_{1yO}}{2\cos^2\alpha \cdot \phi_{init}} \cdot$$

$$\left( l_1 + \frac{1}{\beta_1} \log(1 + \exp(-\beta_1 l_1)) - \frac{1}{\beta_1} \log(1 + \exp(-\beta_1 z)) \right) y =$$

$$y_{centre} + (dy/dz)_{centre}(z + l_1) + \frac{E_{yOoffset} + E_{1yO}}{2\cos^2\alpha \cdot \phi_{init}} \cdot$$

$$\left\{ l_1 \cdot (z + l_1) + (z + l_1) \frac{1}{\beta_1} \log(1 + \exp(-\beta_1 l_1)) - \right.$$

$$\left. \frac{1}{\beta_1} \int_{-l_1}^{z} \log(1 + \exp(-\beta_1 z)) dz \right\}$$

At $z=\zeta_1$ from which ions enters a zone that is free of electric field, the following relation holds true as in the case of equation (11).

$$-\frac{1}{\beta_1} \int_{-l_1}^{\zeta_1} \log(1 + \exp(-\beta_1 z)) dz =$$

$$-(l_1^2/2 + \pi^2/6\beta_1^2)(\zeta_1 + l_1) \cdot \frac{1}{\beta_1} \log(1 + \exp(-\beta_1 l_1)) =$$

$$1.355 \text{ mm}^2 \ll l_1^2/2$$

So, as in the case of equations (8), (9) and (10), $$y = y_{centre} + (dy/dz)_{centre}(z + l_1) + \left\{ \tan\alpha/l_1 + \frac{E_{1yO}}{2\cos^2\alpha \cdot \phi_{init}} \right\} \cdot$$

$$(l_1^2/2 + l_1\zeta_1 - \pi^2/6\beta_1^2)y_{z=\zeta_1} = \zeta_1\tan\alpha + \frac{E_{1yO}l_1(l_1 + \zeta_1)}{\cos^2\alpha \cdot \phi_{init}} =$$

$$-l_1\tan\alpha + (l_1 + \zeta_1)(dy/dz)_{z=\zeta_1}$$

Thus, ions proceed in the deflector as if they followed a straight track all the way to go into a zone free of electric field from the point C defined by $z=-l_1$, $y=-l_1 \tan\alpha$.

(b) Deflection along the x-direction in the first multipole electrostatic deflector 6

The deflection of the ion beam in the first multipole electrostatic deflector is calculated by using a rectangular coordinate system $O_0$-xyz with origin $O_0$ for the inlet side half portion and by using a coordinate system $C_1$-x'y'z' with origin $C_1$, where the z-axis is common to both systems or identical with the z'-axis.

When the x-component of the electric field in the first multipole electrostatic is designated as $E_x(z)$, the relation below holds true for the inlet side half portion of the deflector 6.

$$E(z) = E_{1x0} \cdot 1/(\exp(-\beta_1 z) + 1)$$

Note that if $z=-\zeta_1 x=x_1=0$ and $dx/dz=(dx/dz)_1=0$ at the point of incidence.

Then, the following equation of motion is obtained for the inlet side half portion of the deflector.

$$m \cdot d^2x/dt^2 = eE_{1x0} \cdot 1/(\exp(-\beta_1 z) + 1)$$

On the other hand, the equation of motion below is established for the outlet side half portion of the deflector by using the rectangular coordinate system $C_1$-x'y'z'.

$$m \cdot d^2x/dt^2 = eE_{1x'} \cdot 1/(\exp(\beta_1 z) + 1)$$

By solving the equations of motion as in the case of a) the following relations are obtained for a point departing the extended electric field of the first multipole electrostatic deflector 6 or at $z'=\zeta_1$.

$$(dx'/dz')_{z'=\zeta_1} = \frac{E_{1XO} \cdot l_1}{\cos^2\alpha \cdot \phi_{init}} \quad x'_{z'=\zeta_1} = \frac{E_{1XO} \cdot l_1}{\cos^2\alpha \cdot \phi_{init}} \cdot (l_1 + \zeta_1)$$

Namely, ions proceed straight into the field free region as if they started from the point C on y-z plane passing through the middle point of the central axis of the first multipole electrostatic deflector 6.

(3) The track of ions in the second multipole electrostatic deflector 7

(3)-i) Requirements for the ion beam to meet when it enters the second multipole electrostatic deflector 7

As described in (2) above, let point C be the point distanced from the middle point $C_0$ of the central axis of the first multipole electrostatic deflector 6 by $l_1 \tan\alpha$ along the $-y$-direction, so the track of ions going out of the first multipole electrostatic deflector 6 and entering a zone free of electric field appears as if it were a straight track starting from point C. FIG. 7 three-dimensionally illustrates this situation.

Assume a plane $S_1$ orthogonally that intersects the z-axis at point $C_1$ and also intersects the ion track or the straight line s at point $P_1$. Assume also a perpendicular $P_1H_1$, from the point $P_1$ to the y-z plane and a perpendicular $P_1S_1$. from the point $P_1$ to line $CC_1$ and draw a line segment $S_1K_1$ having a length equal to that of the line segment $H_1 P_1$ from the point $S_1$. Then, $S_1K_1 \perp P_1K_1$, $H_1S_1 \| P_1K_1$ and $P_1H_1 \perp H_1S_1$.

Thus, the following relations are obtained.

$$H_1S_1 = H_1C_1 \cos\alpha = y_{z-l_1} = y_{z-l_1} \cdot \cos\alpha = E_{1yo} \cdot l_1^2/(\cos\alpha \cdot \phi_{init})$$

$$H_1P_1 = x_{z-l_1} = E_{1x0} \cdot l_1^2/(\cos^2\alpha \cdot \phi_{init})$$

$$\tan\delta = E_{1yo}/\cos\alpha E_{1yo} \text{ where } \angle H_1S_1P \text{ is designated as } \delta$$

$$C_1S_1 = l_1/\cos\alpha + H_1C_1\sin\alpha = l_1/\cos\alpha \cdot (1 + l_1E_{1yo}\tan\alpha/\phi_{init})$$

$$\tan\angle C_1CH_1 = \tan\angle S_1CH_1 = H_1S_1/CS_1 = l_1E_{1yo}/(\phi_{init} + l_1E_{1yo}\tan\alpha)$$

$$\tan\angle C_1CK_1 = S_1K_1/CS_1 = H_1P/CS_1 P/CS_1 = l_1E_{1x0}/(\cos\alpha(\phi_{init} = l_1E_{1yo}\tan\alpha))$$

If $\angle C_1CP_1=\beta$ is assumed, then the following relation comes to hold true.

$$\tan\beta = \sqrt{(H_1S_1^2 + H_1P_1^2)/CS_1} = \frac{l_1\sqrt{(E_{1yo}^2 + (E_{1xO}/\cos\alpha)^2)}}{\phi_{init} + E_{1yo} \cdot l_1 \cdot \tan\alpha} \quad (14)$$

Now, the straight line $CC_1$ becomes the second optical axis and a coordinate system O-XYZ can be established, using the line $CC_1$ for the Z-axis, the effective inlet point O of the second multipole electrostatic deflector being located on the Z-axis.

If $OY \| S_1H_1$, the Y-axis is found on the y-z plane and the Y-Z plane perfectly agrees with the y-z plane.

(3)-ii) The track of ions in the second multipole electrostatic deflector 7 a) Equations of motion and the requirements for the ion beam to meet when it enters the second multipole electrostatic deflector 7

The second multipole electrostatic deflector 7 is designed to have a configuration geometrically similar to that of the first multipole electrostatic deflector 6 with the components having dimensions that are $\lambda 2$ times greater than those of their counterparts of the first multipole electrostatic deflector 6 and identical raster voltages are applied respectively to the electrodes of the first multipole electrostatic deflectors 6 and to the corresponding electrodes of the second multipole electrostatic deflector 7. Establish a rectangular coordinate system $O_1-X'Y'Z'$, using the effective outlet point O1 of the second multipole electrostatic deflector 7. Since the distribution of electric field in the second multipole electrostatic deflector 7 is similar to that of electric field in the first multipole electrostatic deflector 6, the electric field distribution is expressed by equation $$E_2 = E_{20}/(\exp(-\beta_2 Z)+1)$$

for the inlet side half portion of the second multipole electrostatic deflector 7, whereas it is expressed by equation $$E_2 = E_{20}/(\exp(\beta_2 Z')+1)$$

for the outlet side half portion of the deflector, where $\beta_2 \beta_1/\lambda_2$ $E_{20} = -E_{10}/\lambda_2$ $\zeta_2 = \zeta_2 \cdot \zeta_1$ $\zeta_2 = \zeta_2 \cdot \zeta_1$ Thus, the following equations of motion can be obtained.

$m \cdot d^2X/dt^2 = e \cdot E_{2x0}$ $m \cdot d^2Y/dt^2 = e \cdot E_{2y0}$ $m \cdot d^2Z/dt^2 = O$ The requirement to be met by ions entering the deflector is $$\tfrac{1}{2} \cdot ((dX/dt)_2^2 + (dY/dt)_2^2 + (dZ/dt)_2^2) = e \, \phi_{init},$$

where $(dX/dt)_2$, $(dY/dt)_2$ and $(dZ/dt)_2$ are respectively the X, Y and Z components of each ion entering the second multipole electrostatic deflector 7. From (3)-i), there is obtained the following equation.

$$(dX/dt)_2^2 + (dY/dt)_2^2 = \tan^2\beta \cdot (dZ/dt)_2^2$$

If the electric field is perpendicular to the Z-axis in the second multipole electrostatic deflector 7 as in the case of the first deflector, the following relations hold true.

$$1/2 \cdot (1 + \tan^2\beta) \cdot (dZ/dt)^2 = e/m \cdot \phi_{init}, (dZ/dt)^2 =$$

$$\frac{2e}{m} \left( 1 + \frac{l_1^2(E_{1y0}^2 + (E_{1x0}/\cos\alpha)^2)}{(\phi_{init} + E_{1y0} \cdot \tan\alpha)^2} \right)^{-1} \cdot \phi_{init}$$

or $$(dZ/dt)^2 = \cos^2\beta \cdot 2e/m \cdot \phi_{init}.$$

b) The track of ions along the X-axis b-i) The parallelism of the track of ions after leaving the second multipole electrostatic deflector 7

$$dX/dZ = (dX/dt) \cdot (dt/dZ) = \int \frac{d^2X}{dt^2} \, dt \cdot (dt/dZ) = \int \frac{d^2X}{dt^2} \, dZ \cdot (dt/dZ)^2$$

If $(dX'/dZ')$ at a point immediately downstream to the second multipole electrostatic deflector 7 on the ion beam track, or $Z' = \zeta_2$, is expressed by $(dX'/dZ')_{out}$, $$(dX'/dZ')_{out} = (dX/dZ)_2 + \int_{-\zeta_2}^{l_2} \frac{E_{2x0} dZ}{\exp(-\beta_2 Z)+1} \cdot \frac{0.5}{\cos^2\beta \cdot \phi_{init}} +$$

$$\int_{-l_2}^{\zeta_2} \frac{E_{2x0} dZ'}{\exp(\beta_2 Z')+1} \cdot \frac{0.5}{\cos^2\beta \cdot \phi_{init}} \quad (dX/dZ)_2 = \tan\angle C_1 C K_1 =$$

$$\frac{l_1 E_{1x0}}{\cos\alpha(\phi_{init} + E_{1y0} l_1 \tan\alpha)}$$

By an integrating operation, the following equations are obtained.

$$(dX'/dZ')_{out} = \frac{l_1 E_{1x0}}{\cos\alpha(\phi_{init} + E_{1y0} l_1 \tan\alpha)} + \frac{E_{2x0} l_2}{\phi_{init} \cdot \cos^2\beta} \cdot \frac{1}{\cos^2\beta} =$$

$$1 + \frac{l_1^2(E_{1y0}^2 + E_{1x0}^2/\cos^2\alpha)}{(\phi_{init} + E_{1y0} l_1 \tan\alpha)^2}$$

If, for example, $E_{1y0}=0$, $\phi_{init}=200$ kV, $E_{1x0}=1883.4$ V/cm (the outer periphery of an 8-inch wafer: corresponding to X=10 cm), $\alpha=3.5°$, $l_1=180.475$ mm, $\zeta_1=119.525$ mm, $\beta_1=0.0459$ mm$^{-1}$ and $\lambda=7/3$, the above equation can be calculated to produce the result shown below for $(dX'/dZ')_{out}$.

$$(dX'/dZ')_{out} = -0.0469 = \tan^{-1}(-0.269°)$$

A comparably small value will be obtained for $(dY'/dZ')_{out}$ through calculation.

Therefore, the ion beam departing the second multipole electrostatic deflector 7 is held in parallel with the optical axis with a limit of error of 0.3°.

b-ii) The track of ions along the X-axis in the second multipole electrostatic deflector 7

If the reading of the X'-coordinate of the ion moving out of the second multipole electrostatic deflector 7 into a zone free of electric field is $X'_{out}$ at point $(Z'=\zeta_2)$ and the various values at the effective inlet point $(Z'=\zeta_2)$ are expressed with an affix of "2", while the values at the middle point are expressed with an affix of "$centre$", the following equation can be obtained.

$$X'_{out} = \int \frac{dX}{dZ} \, dZ = \iint \frac{d^2X}{dt^2} \, dZ dZ (dt/dZ)^2 =$$

$$X_2 + \int_{-\zeta_2}^{l_2} (dX/dZ)_2 dZ + \int_{-l_2}^{\zeta_2} (dX'/dZ')_{centre} \, dZ' +$$

$$\frac{1}{2\phi_{init} \cdot \cos^2\beta} \left( \int_{-\zeta_2}^{l_2} \int_{-\zeta_2}^{l_2} E_{2x} dZ dZ + \int_{-l_2}^{\zeta_2} \int_{-l_2}^{\zeta_2'} E_{2x} dZ' dZ' \right)$$

Now, if the distance between the effective outlet point (Z'=0) of the second multipole electrostatic deflector 7 and the substrate is $L_D$ and the spot of the ion beam on the substrate is defined by $(X_W, Y_W)$, then $$X_w = X'_{out} + (dX'/dZ')_{out}'(L_D - \zeta_2)$$

By calculating the above equation, introducing standardized deflecting electric fields $\xi_1, \eta_1, \xi_1, \eta_2$ and using $$(l_1 E_{1x0}/\phi_{init}) = \xi_1, \quad (l_1 E_{1y0}/\phi_{init}) = \eta_1$$

$$(l_2 E_{2x0}/\phi_{init}) = \xi_2, \quad (l_2 E_{2y0}/\phi_{init}) = \eta_2$$

the following equation can be obtained.

$$X_w = \frac{\xi_1(l_1/\cos\alpha + L + 2l_2 + L_D)}{\cos\alpha(1 + \eta_1\tan\alpha)} + \xi_2\left(1 + \frac{\xi_1(l_1^2/\cos^2\alpha + \eta_1^2)}{(1+\eta_1\tan\alpha)^2}\right)(l_2 + L_D) \quad (15)$$

c) The track of ions along the Y-axis in the second multipole electrostatic deflector 7

As in the case of b) above, the direction of the track of ions $(dY'/dZ')_{out}$ at the outlet point $(Z'=\zeta_2)$ of the second multipole electrostatic deflector 7 and the reading Yw of the Y-axis of the beam spot on the substrate are expressed respectively by the following equations.

$$(dY'/dZ')_{out} = \frac{l_1 E_{1y0}}{(\phi_{init} + E_{1y0}l_1\tan\alpha)} + \frac{E_{2y0}l_2}{\phi_{init} \cdot \cos^2\beta} \quad \frac{1}{\cos^2\beta} = 1 + \frac{l_1^2(E_{1y0}^2 + E_{1x0}^2/\cos^2\alpha)}{(\phi_{init} + E_{1y0}l_1\tan\alpha)^2} \quad (16)$$

$$Y_w = \frac{\eta_1(l_1/\cos\alpha + L + 2l_2 + L_D)}{(1+\eta_1\tan\alpha)} + \eta_2\left(1 + \frac{\xi_1^2/\cos^2\alpha + \eta_1^2}{(1+\eta_1\tan\alpha)^2}\right)(l_2 + L_D)$$

As the second multipole electrostatic deflector 7 is geometrically similar to the first multipole electrostatic deflector 6 and the raster voltages applied to the respective electrodes of the second multipole electrostatic deflector 7 corresponding to those of the first multipole electrostatic deflector 6 (e.g., 6a corresponding to 5a in FIG. 3) in order to deflect back the ion beam that has been deflected by the first deflector 6 are obtained by subtracting the offset voltage from the respective voltages applied to the corresponding electrodes of the first deflector 6 (or the deflectors are designed on the basis of the law of similarity as described earlier), the following relations can be drawn from (b-ii) above.

$$\xi_1 = -\xi_2, \quad \eta_1 = -\eta_2$$

(B) The functions for the operation of digital scan to be used for the electric fields to produce a raster with a beam spot moving with a uniform speed on the substrate From the equations (15) and (16) introduced above with regard to (A), it is seen that, if the multipole electrostatic deflectors are designed on the basis of the law of similarity, the readings on the $X_w$–$Y_w$ coordinate system of the beam spot on the substrate are not exactly proportional to the respective electric fields $E_{1x0}$ and $E_{1y0}$ for raster deflection as they have non-linear items. Therefore, if the rate of change in the electric field $E_{1x0}$ for raster deflection and the rate of change in the electric field $E_{1y0}$ for raster deflection remain constant with time regardless of the readings on the $X_W$–$Y_W$ coordinate system, the speed of the moving beam spot is lowered to stay in a unit area for a prolonged period of time as it approaches the outer periphery of the substrate. This gives rise to excessive ion implantation in the peripheral area of the substrate as compared with the central area.

In order to eliminate the phenomenon of uneven dose distribution and achieve an even dose distribution, the rate of change in the intensity of raster electric field has to be raised in the peripheral area of the substrate. Now, functions that can be successfully used to change the rate of deflecting electric field will be discussed.

(1) Normalised dose distribution function

The examination of the dose distribution is carried out in the case where line speed of the rastered ion beam spot on the substrate changes with the co-ordinate of the spot on the wafer if the rate of change in the electric field is not varied with a suitable manner.

Figure 9:
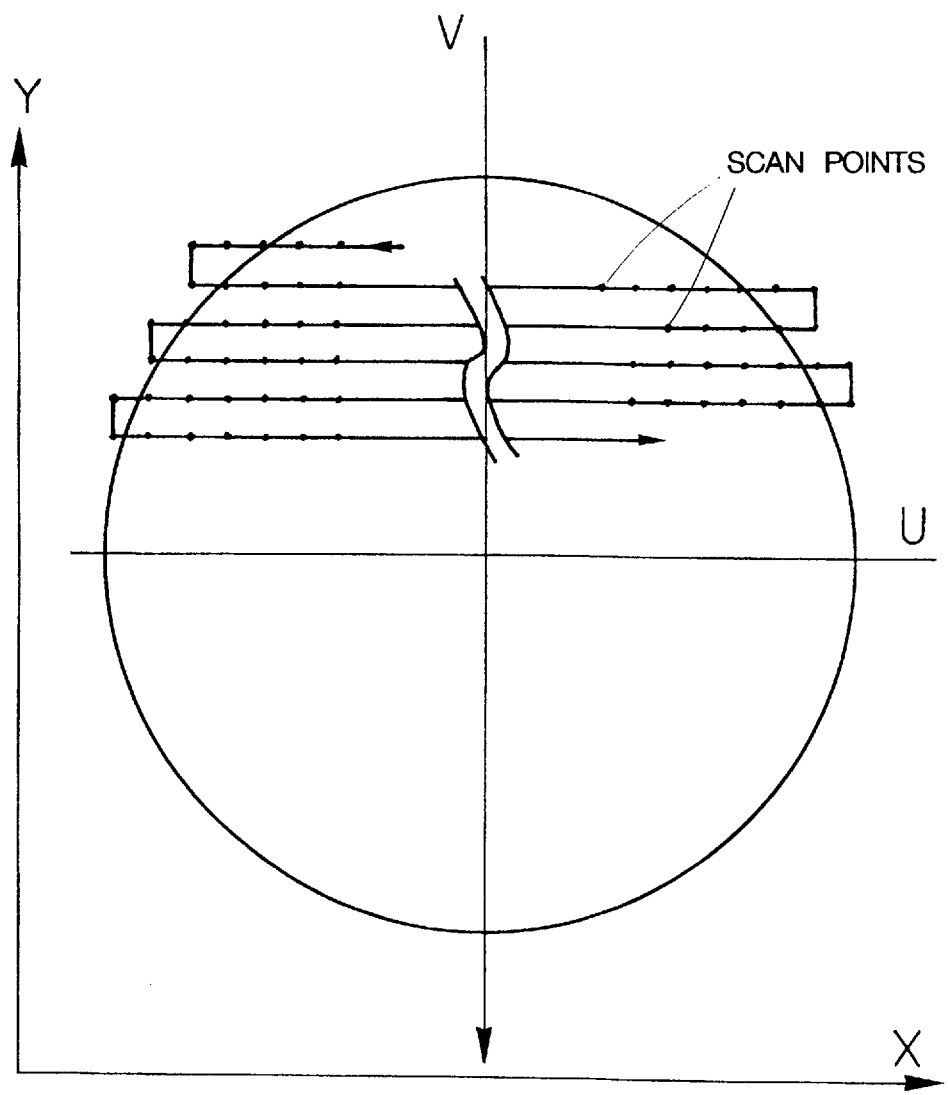
FIG. 9 is a schematic view of the surface of a substrate digitally scanned by an ion beam.

Beam spot is rastered on the substrate as shown in FIG. 9, but the spacing of the stripes and spot line speed are dependent on the co-ordinate of the spot on the wafer.

Figures 16A, 16B:
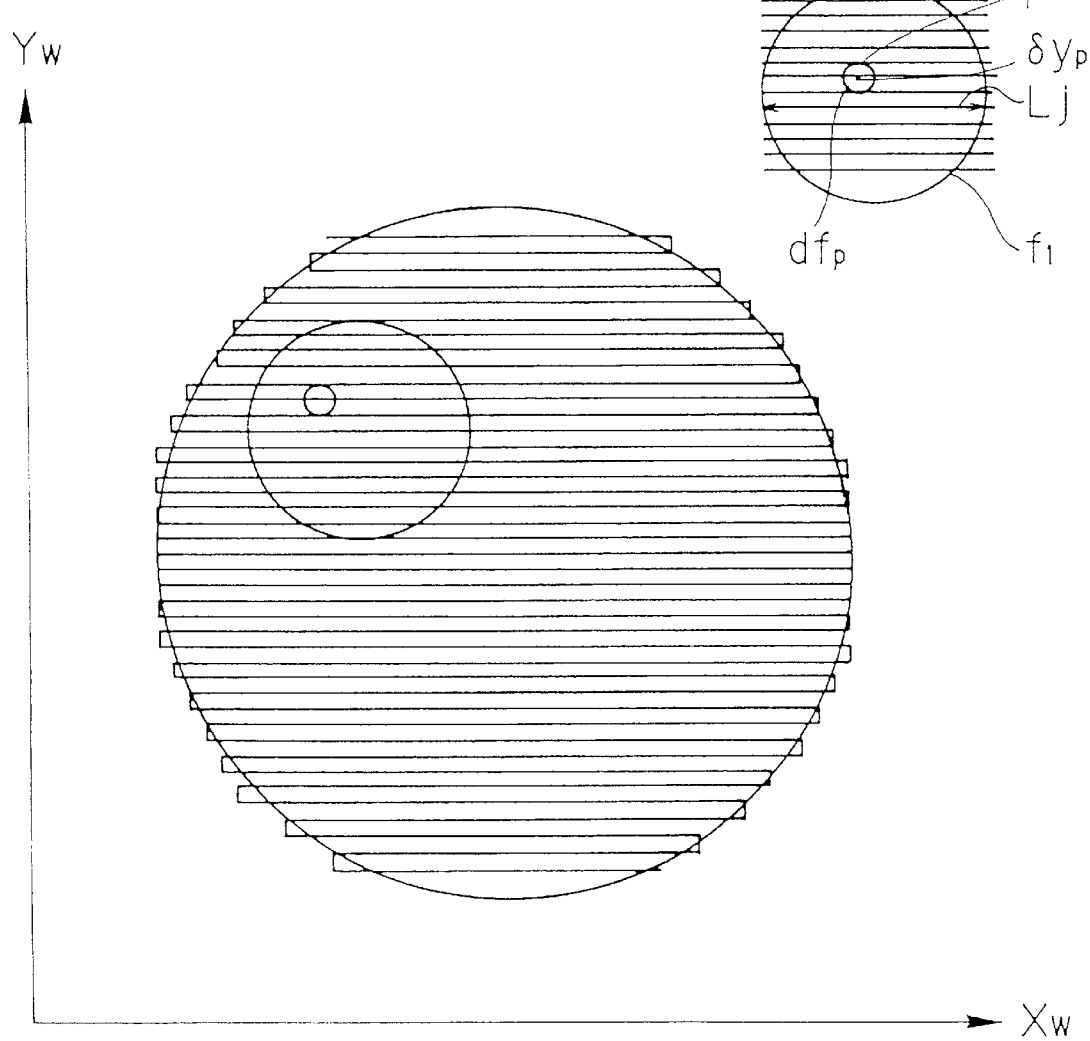
FIG. 16 is a schematic view for explaining a dose density at a point P on the substrate which is independent of the spot size and shape of an ion beam on the substrate.

Referring to FIG. 16, assuming the distribution of beam current density is homogenious inside the beam spot the charge $dq_1$ falling on the area element $df_P$ at the point P on the substrate during the time dt is given by the following equation, $$dq_1 I/f_1 \cdot df_P \cdot dt$$

here I denotes the total beam current and $f_1$ spot area.

As the shift of raster stripe line is smaller than beam spot size on the substrate, the spot passes about ten times on the area clement $df_P$ during one raster. The total charge $dQ_P$ accumulated on $df_P$ is given as $$dQ_P = \Sigma dq = i \cdot dt \Sigma L_1 / V_{xP} = I/f_1 df_P \cdot \Sigma L_i / v_{xP} = I \cdot df_P \cdot (\Sigma L_i \cdot \delta y_P) / (f_1 \cdot \delta y_P \cdot v_{xP}) = I \cdot df_P / (\delta y_P \cdot v_{xP})$$

Dose density at P after total number of raster N is done is given as $$D^* = dQ_P / df_P \cdot N = I/(\delta y_P \cdot v_x) \cdot N$$

and it is independent of the spot size and shape on the substrate or wafer.

We consider that the first and second deflectors are geometrically simillar to each other and operated by common rastering electrode voltages. Let the effective length of two deflectors be $L_1 = 2_1 l$ and $L_2 = 2l_2$, respectively, and deflecting electric fields be $E_1$ and $E_2$. Also, we introduce standardized deflecting electric fields $\xi_1, \eta_1, \xi_2$ and $\eta_2$.

$$(l_1 E_{1x0}/\phi_{init}) = \xi_1, \quad (l_1 E_{1y0}/\phi_{init}) = \eta_1$$

$$(l_2 E_{2x0}/\phi_{init}) = \xi_2, \quad (l_2 E_{2y0}/\phi_{init}) = \eta_2$$

Figure 1:
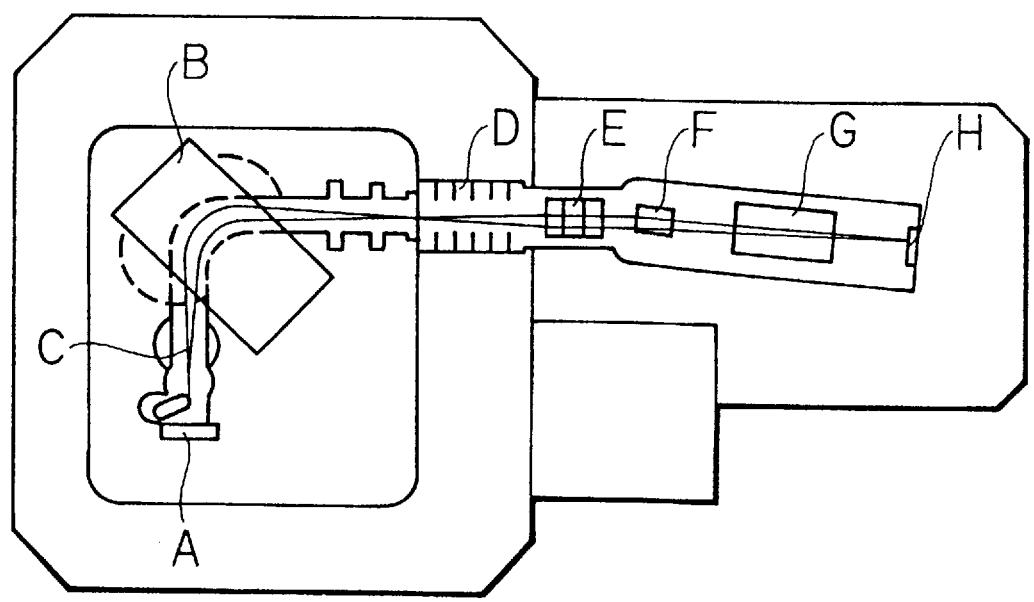
FIG. 1 is a schematic side view of a conventional parallel scan type ion implanter.
Figure 2:
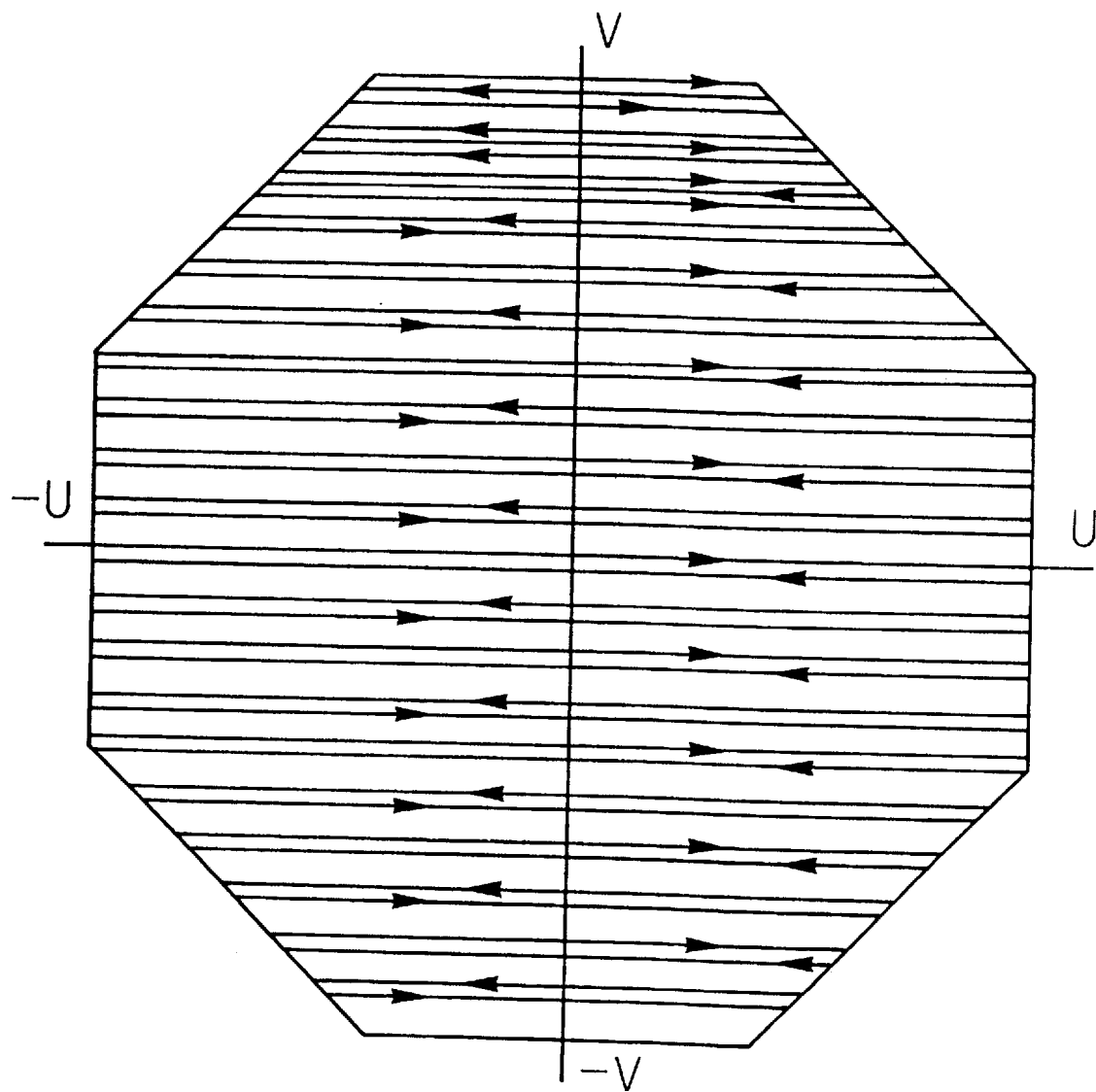
FIG. 2 is a view showing how the ion beam is operated in the conventional parallel scan type ion implanter.
Figure 3A:
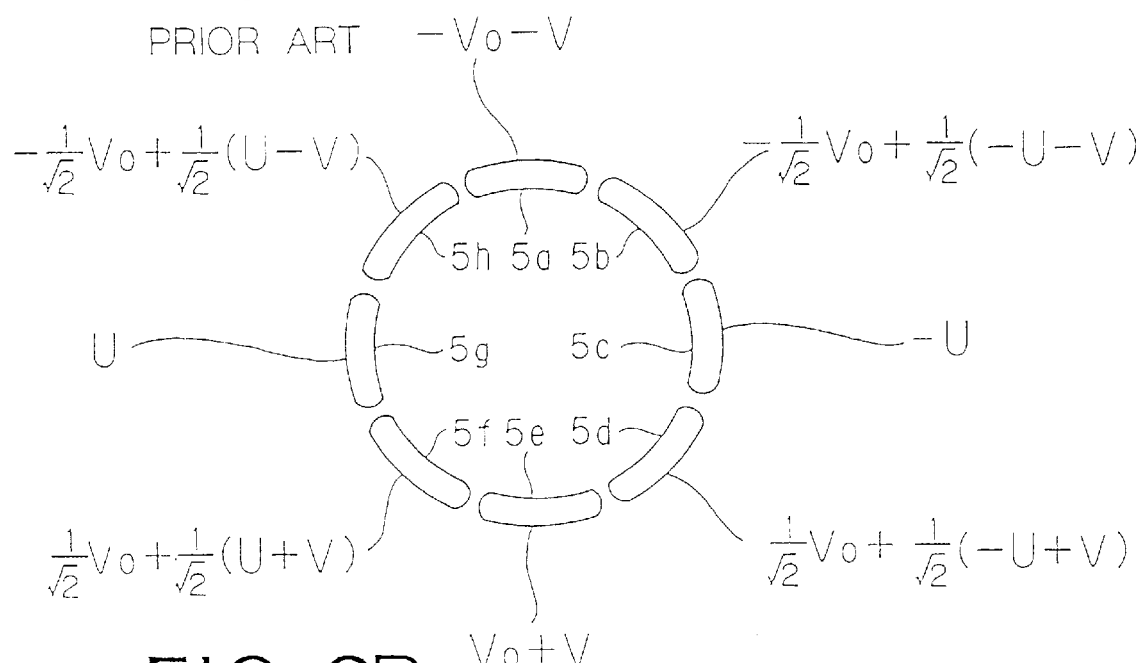
FIG. 3 is a schematic illustration showing the voltages to be applied to the respective electrodes of a conventional parallel scan type ion implanter comprising an octapole electrostatic deflector.
Figure 3B:
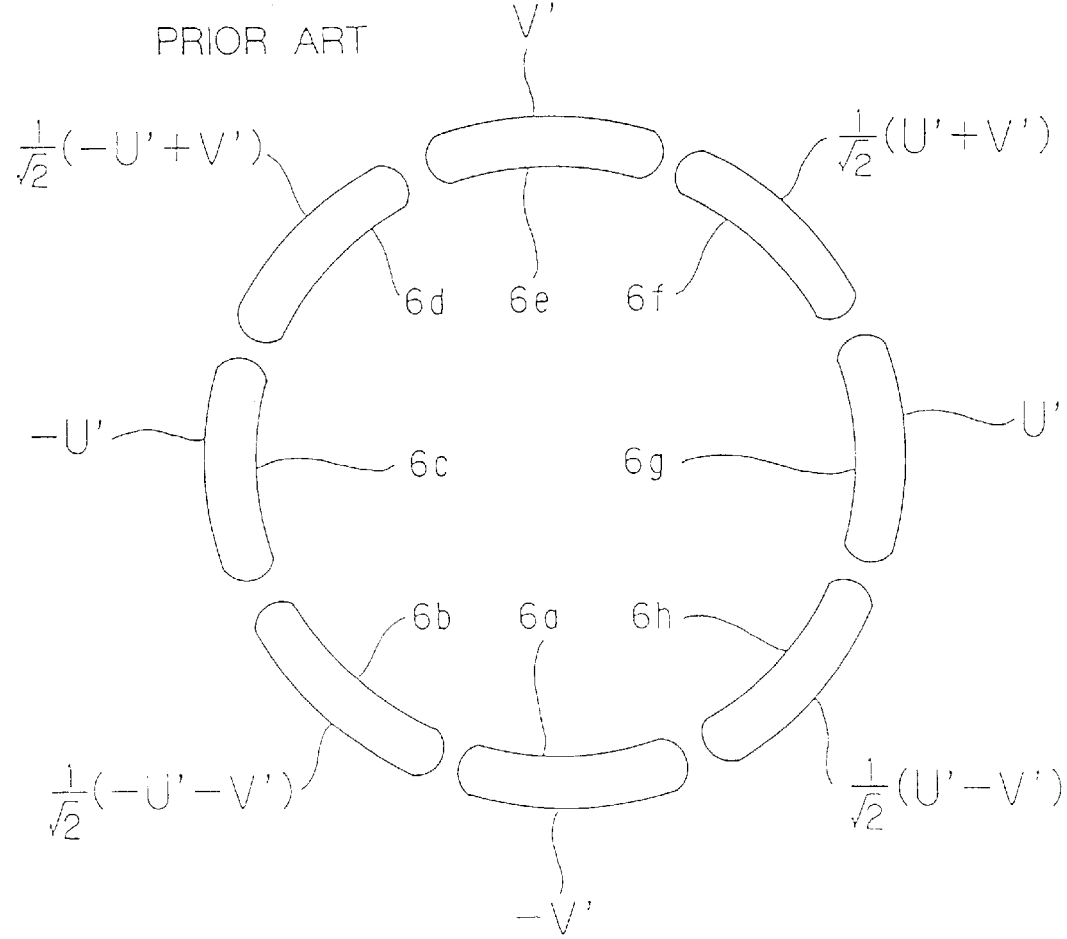

From geometrical similarity and common rastering electode voltage as shown in FIG. 3, the following relations are obtained.

$$\xi_1 = -\xi_2, \quad \eta_1 = -\eta_2$$

The step of voltage from one stripe to the next is kept constant. The co-ordinate system of the beam spot on the wafer set perpendicular to the optical axis is function of $\xi_1, \xi_2, \eta_1$, and $\eta_2$ and expressed by relations above, $$X_w = f(\xi_1, \eta_1) Y_w = g(\xi_1, \eta_1).$$

The raster is carried out, as shown in FIG. 9, changing the y-component of $E_1$ as a step like function, keeping $$\delta\eta_1 = \text{constant}$$

and changing $d\xi_1/dt$ as a function of $\xi_1$ and $\eta_1$ so as to keep dose density is uniform over the substrate. We consider how to chage the rastering electric field with its co-ordinates on the substrate.

Figure 8:
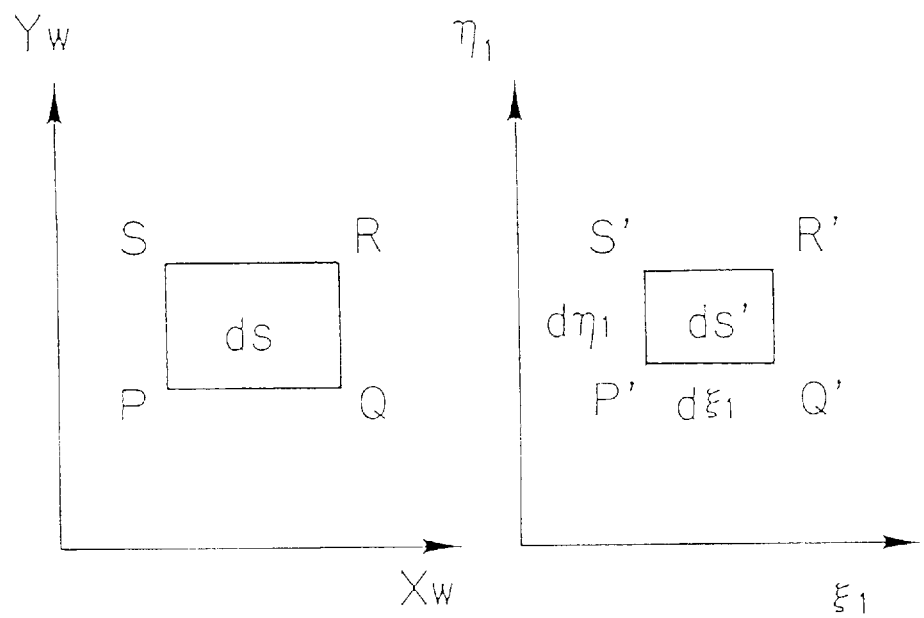
FIG. 8 is a graph illustrating how to obtain a digital scan function necessary for the electric field applied to the ion beam in an ion implanter according to the invention in order to produce a raster when the beam spot is moved with a constant speed on the substrate.

If, now, a small area $dS'(dS'=d\xi_1 \cdot d\eta_1)$ on the $\xi_1-\eta_1$ coordinate system corresponds to a small area $dS$ ($dS=dX_W \cdot dY_W$) on the $X_W-Y_W$ coordinate system as illustrated in FIG. 8, the following equations can be obtained.

$$dS = |J| \cdot dS' \quad (17)$$

$$J = \begin{vmatrix} \frac{\partial f}{\partial \xi_1} & \frac{\partial g}{\partial \xi_1} \\ \frac{\partial f}{\partial \eta_1} & \frac{\partial g}{\partial \eta_1} \end{vmatrix}$$

where J is a functional determinant or Jacobian. The value of J at the the center of the substrate id sesignated as $J_o$.

Thus, dose density at P is written as $$D^* = I \cdot N/(dX_W/dt \cdot \delta Y_{WP}) = I \cdot N/(|J| \cdot d\xi_1/dt \cdot \delta\eta_1)$$

$D^*$ must be equal to dose density at the centre of the substrate in order that $D^*$ is uniform over all the substrate. Thus, if affix o is given to the various values at the center of the wafer and * is given to the values on the $\xi_1-\eta_1$ coordinate system, the following equations are obtained. The dose density at the center of the substrate is designated as $D_0$.

$$|J| \cdot d\xi_1/dt \cdot \delta\eta_1 = |J|_o \cdot (d\xi_1/dt)_o \cdot (\delta\eta_1)_o d\xi_1/dt = (|J|_o/|J|) \cdot (d\xi_1/dt)_o (dE_{1x0}/dt)_{XW,YW} = (|J|_o/|J|) \cdot (dE_{1x0}/dt)_o (dU/dt)_{XW,YW} = (|J|_o/|J|) \cdot (dU/dt)_o = F_N(X_W, Y_W) \cdot (dU/dt)_o \quad (18)$$

Thus, a function $F_N$ as shown below can be defined for a standardized or normalised dose function.

$$D^*/D_0(|J|_o/|J|) = F_N(X_W, Y_W)$$

The equation (19) shows the way to modulate raster speed $(dU/dt)$ at beam spot co-ordinate $(X_W, Y_W)$ in order to obtain perfect uniformity all over the wafer.

Through calculation using $F_N(\xi_1\eta_1)$ and the equations (18), (17), (16) and (15) in order to achieve an accuracy of 0.1%, the following equation is obtained by neglecting minute terms.

$$F_N(\xi_1, \eta_1) = 1 + \eta_1 \tan\alpha \left(3 + \frac{3(l_2+L_D)}{l_1+L+l_2}\right) + \frac{4\xi_1^2}{\cos^2\alpha} \left(\frac{l_2+L_D}{l_1+L+l_2}\right) + 4\eta_1^2 \left(\frac{l_2+L_D}{l_1+L+l_2}\right) \quad (19)$$

If the following approximations are used, considering that $\alpha=3.5°$ and $1/\cos\alpha=1.00187$, $$X_W \sim \xi_1(l_1+L+l_2)$$

$$Y_W \sim \eta_1(l_1+L+l_2)$$

then, the equation shown below is obtained.

$$F_{N(XW,YW)} = 1 + \lambda_1 X_W + \lambda_2 Y_W + \lambda_3 X_W^2 + \lambda_4 Y_W^2$$

where $\lambda_1 = 0$, $$\lambda_2 = \tan\alpha \frac{3 + \frac{3(l_2+L_D)}{l_1+L+l_2}}{l_1+L+l_2}, \quad (20)$$

$$\lambda_3 = \frac{4(l_2+L_D)}{(l_1+L+l_2)^3 \cos^2\alpha},$$

and $$\lambda_4 = \frac{4(l_2+L_D)}{(l_1+L+l_2)^3}.$$

Now, actual procedures for realizing raster deflection to produce an even and uniform dose distribution on a substrate by using the standardized dose function shown above will be discussed.

The arrangement for realizing raster deflection is substantially same as those disclosed in Japanese Patent Kokai Nos. 2-258113 and 3-102750 except that the operation of digital scan is conducted in a manner as described above for the purpose of the present invention. FIG. 3 schematically illustrates a typical arrangement of electrodes for raster deflection. As shown in FIG. 3, the deflecting voltage is varied stepwise for the vertical direction (the direction of $Y_W$ for the wafer, the direction of V for the deflecting voltage) with a step of $\Delta V$ and the rate of change with time of the deflecting voltage U is varied for the horizontal direction as a function of the location on the substrate.

$$E_{1x0} = k \cdot U/r_0, \quad E_{1y0} = k \cdot V/r_0$$

where k is a constant specific to the geometrical arrangement of the electrodes of the multipole electrostatic deflector and equal to 0.96 for an octapole deflector with the central angle of 35° seeing arc of the cross section of an electrode. Note that the value of k is equal to 1 for an ideal multipole electrostatic deflector with infinite number of electrodes.

With the above described arrangement for raster deflection, since the electric field is varied stepwise with a given step for the vertical direction, $\delta\eta_1 = (\delta\eta)_o = $ constant for the equation (12). Therefore, $E_{1x0}$ needs to be varied as a function of the location on the wafer so that the following equation is established.

$$d\xi_1/dt = F_N(d\xi_1/dt)_o \quad (21)$$

Thus, the rate of change with time of the voltage U needs to be varied depending on of the location of the wafer so that the equation below is always held true.

$$(dE_{1x0}/dt)_{WX,YW} = F_N(X_W, Y_W) \cdot (dE_{1x}/dt)_o \quad (22)$$

or $$(dU/dt)_{XW,YW} = F_N(X_W, Y_W) \cdot (dU/dt)_o \quad (23)$$

A typical voltage generating circuit to be used for applying voltages to the first and second multipole electrostatic deflectors 6 and 7, each having an octapole configuration, will now be discussed by referring to FIGS. 9 and 10.

As shown in FIG. 9, assume that the number of scan points on the substrate is 64 for the X-direction and 128 for the Y-direction and these points are scanned by following the scanning line illustrated in FIG. 9 with arrows.

Figure 10:
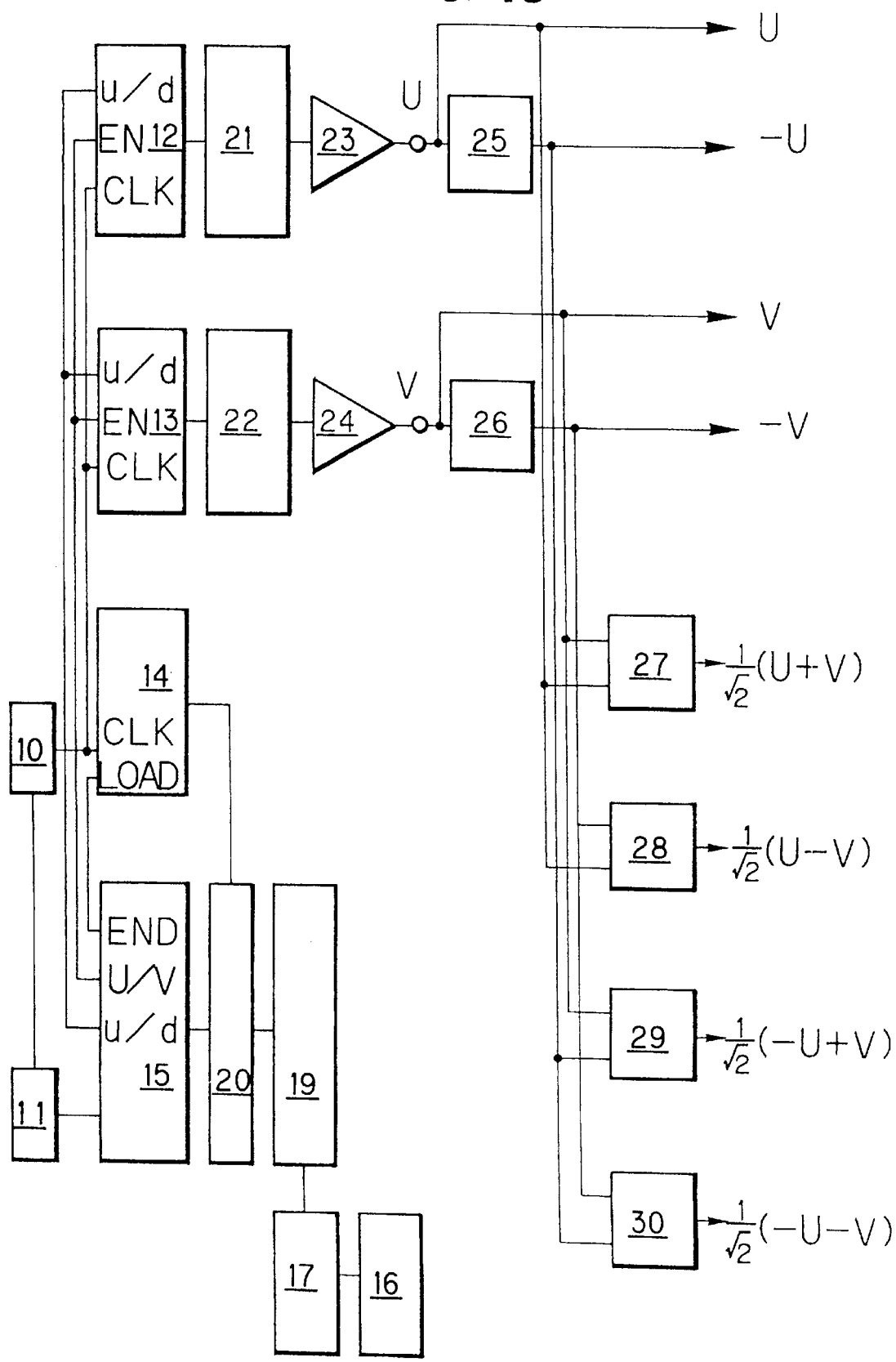
FIG. 10 is a block diagram of a voltage generating circuit to be used for digital scan.

Referring to FIG. 10 showing a block diagram of the circuit, it comprises a voltage/frequency converter 10, a D/A converter 11, a first up/down counter 12, a second up/down counter 13, a counter 14, a RAM 15, a ROM 16, a CPU 17, a 3-state circuit 19, a multiplexer circuit 20, a pair of D/A converters 21 and 22, a pair of amplifiers 23 and 24, a pair of inversion circuits 25 and 26 and a series of addition circuits 27 through 30, which are interconnected in the illustrated manner.

The data stored in the ROM 16 on the scan points and the date on the speed with which each of the scan points is scanned on the substrate are stored in the RAM 15 by the CPU 17. A scan point is specified by the reading of the counter 14, which also addresses the RAM 15. In other words, the output of the counter 14 addresses the RAM 15 and data on the scanning speed and control signals for the up/down counters 12 and 13 are produced by the data stored in the RAM 15.

When the RAM 15 is addressed by the output of the counter 14, the digital data on the scanning speed stored in the RAM 15 are converted into an analog voltage signal, which is then fed to the voltage/frequency converter 10, which produces a frequency signal that corresponds to the data on the scanning speed. The obtained frequency signal is then fed to the first and second up/down counters 12 and 13 and the counter 14 as a clock signal. The first and second up/down counters 12 and 13 and the counter 14 counts the frequency signal fed from the voltage/frequency converter 10 as a clock signal to produce corresponding coordinate data. The coordinate data produced by the counter 14 are then transmitted to the RAM 15 as an address signal, which is used to produce data on the scanning speed and control signals for the up/down counters 12 and 13. The counter 14 causes the data on the scanning speed for the scan point to be transmitted from the RAM 15 to the voltage/frequency converter 10 by way of the D/A converter 11. The control signals from the RAM 15 make the first and second up/down counters 12 and 13 select their respective motions and modes of counting, up mode or down mode. The outputs of the first and second up/down counters 12 and 13 are converted to analog voltages by the respective D/A converters 21 and 22, which are by turn made into U and V voltages respectively by the amplifiers 23 and 24, that are essential for the scanning operation.

Each set of data to be stored in the RAM 15 for the corresponding set of coordinate data are fed externally or from an internal ROM under the control of the CPU 17. During the scanning operation, the operation of the RAM 15 is isolated from the CPU 17 by means of the 3-state circuit 19 and the multiplexer circuit 20 so that it may be addressed by the counter.

The U and V voltages obtained respectively from the first and second up/down counters 12 and 13 by way of the D/A converters 21 and 22 and the amplifiers 23 and 24 are then processed by the two inversion circuits 25 and 26 and the four addition circuits 27 through 30, each of which comprises an operational amplifier having inversion, addition and gain varying capabilities, to produce voltages as shown in the drawing for the eight electrodes.

Thus, digitally controlled voltages for raster deflection are produced so that each of the scan points on the substrate is scanned with a scan speed that is appropriate for it.

Figure 11:
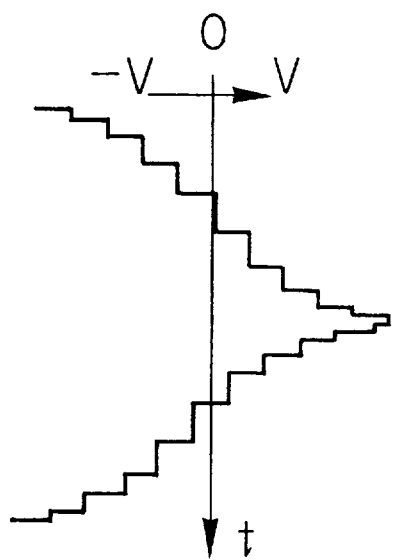
FIG. 11 is a reference V voltage waveform obtained by the circuit of FIG. 10.
Figure 12:
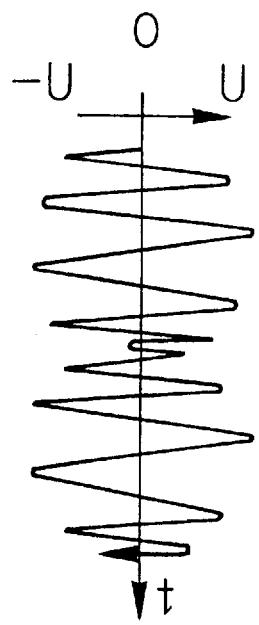
FIG. 12 is a reference U voltage waveform obtained by the circuit of FIG. 10.
Figure 13A:
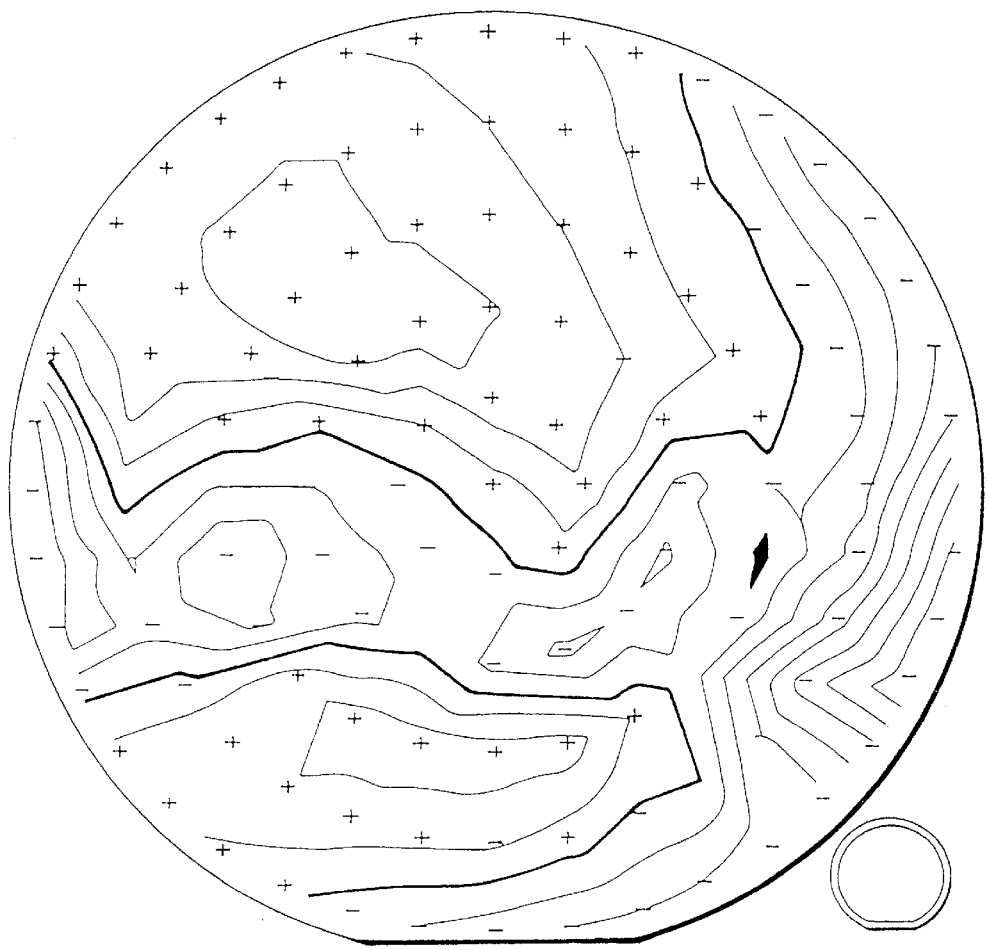
FIG. 13A is a graph showing a sheet resistance distribution on a substrate implanted with ions by a conventional ion implanter that does not utilize digital scan with 0°–7° offset deflection.
Figure 13B:
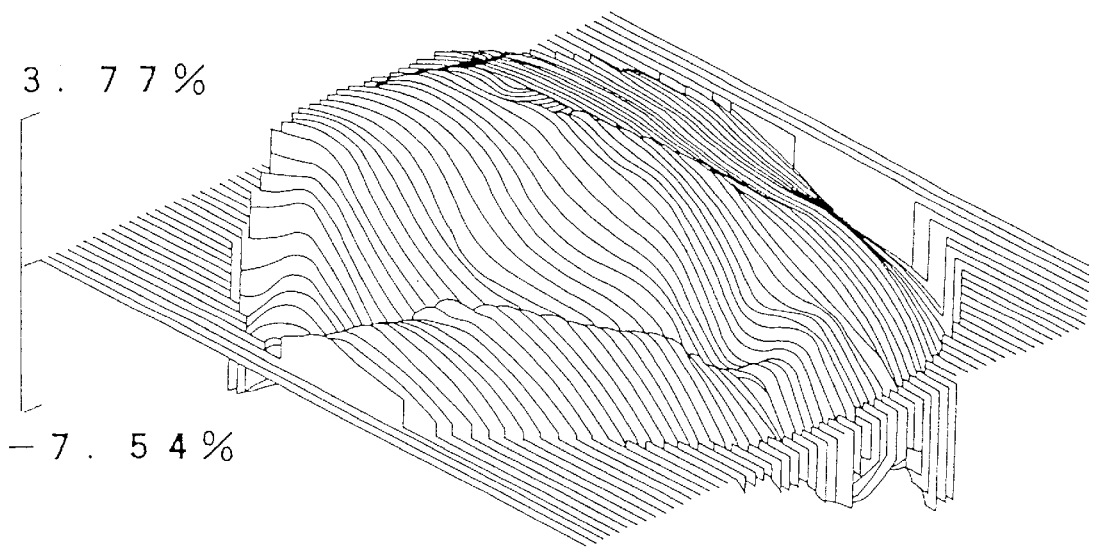
FIG. 13B is a schematic perspective view of the sheet resistance distribution shown in FIG. 13A.

FIGS. 11 and 12 respectively shows reference waveforms for V and U voltages that can be obtained by the circuit of FIG. 10.

An ion implanter of the type under consideration can be provided with means for ensuring that the operation of implanting ions on the substrate is actually going on in a controlled manner as described above.

From normalized dose function $F_N(X_W, Y_W)$, the constant of a variation which corresponds in definition to "standard deviation in %" obtained from an instrument for measuring the dose distribution in an implanted wafer is calculated as $$C = \frac{\sqrt{[(1/4(\lambda_1^2 + \lambda_2^2) + 1/16((\lambda_3^2 + \lambda_4^2) - 1/24(\lambda_3 \times \lambda_4))r_1^2]} \times r_1}{(1 + 1/4(\lambda_3 + \lambda_4)r_1^2)}$$

where $r_1$ is an outer diameter of wafer.

As shown in Table 1, from the examples obtained, the value of C calculated as indicated above indicates approximate value obtained from the wafers which were implanted with a variety of systems manufactured.

In an actual design of a system, the dimension of each component of the system should be determined so that the value thus calculated is less than four times as large as the value aimed at by the degital scanning which is intended.

TABLE 1

|  | Sample 1 | Sample 2 | Sample 3 |
| --- | --- | --- | --- |
| Wafer Size (inch) | 3–6 | 5 | 8 |
| Diameter of First Multipole Electrostatic Deflector (mm) | 150 | 150 | 150 |
| Length of First Deflector (mm) | 580 | 400 | 400 |
| Distance between First and Second Multipole Electrostatic Deflector (mm) | 336 | 405 | 405 |
| Diameter of Second Multipole Electrostatic Deflector (mm) | 220 | 330 | 330 |
| Length of Second Multipole Electrostatic Deflector (mm) | 859 | 868 | 868 |
| Distance between Second Multipole Electrostatic Deflector and Wafer (mm) | 1148 | 810 | 810 |
| Distance from Inlet of First Multipole Electrostatic Deflector and Wafer (mm) | 2923 | 2483 | 2483 |
| Diameter of Mask (mm) | 95 | 145 | 200 |
| Standard Deviation (Calculated Value) (%) | 0.735397 | 1.184859 | 1.996156 |
| Standard Deviation before Correction (Measured Value) (%) | 0.7–0.59 | 1.24 | 2.06 |
| Standard Deviation after Correction (Measured Value) (%) | 0.25 | 0.34 | 0.78 |

Figure 14A:
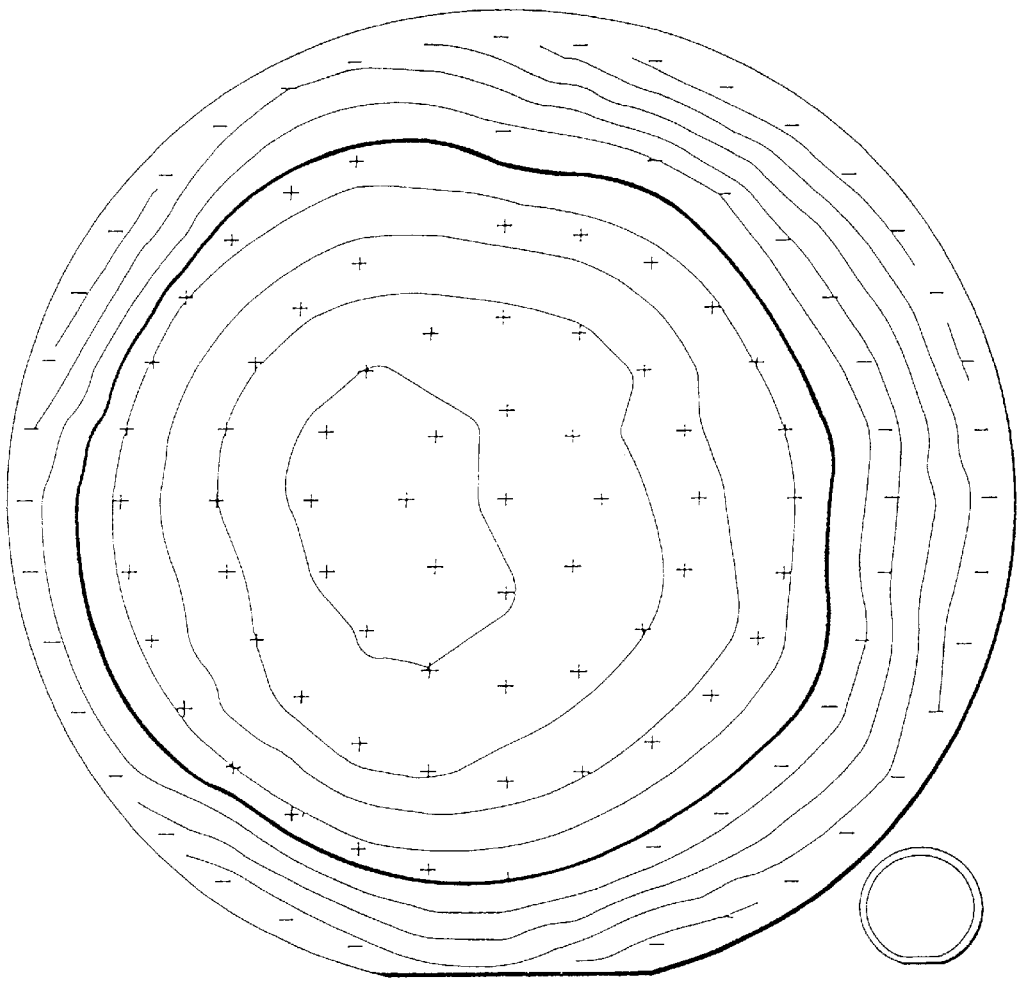
FIG. 14A is a graph showing the sheet resistance distribution on a substrate implanted with ions by means of an ion implanter with 3.5°–3.5° offset without digital scan.
Figure 14B:
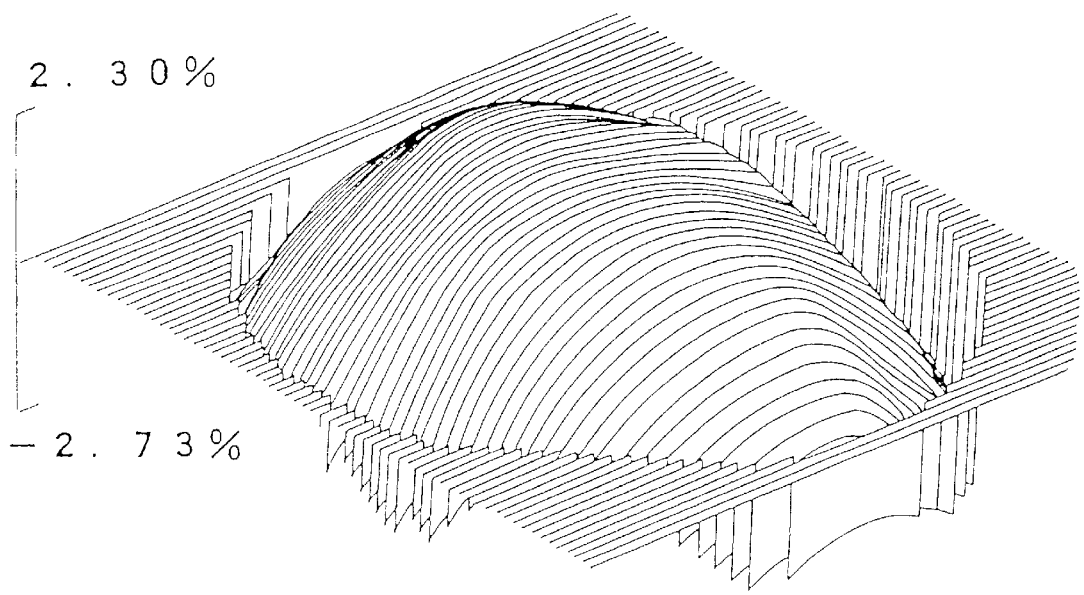
FIG. 14B is a schematic perspective view of the sheet resistance distribution shown in FIG. 14A.
Figure 15A:
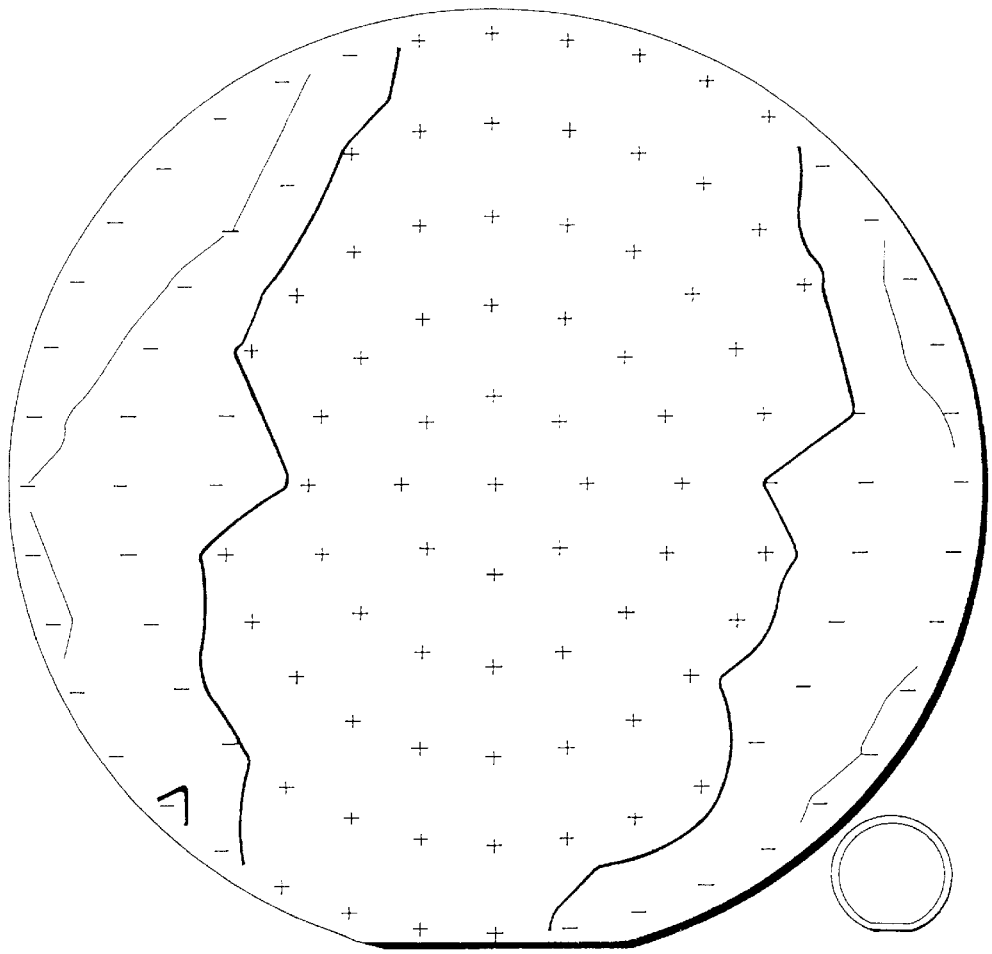
FIG. 15A is a graph showing the sheet resistance distribution on a substrate implanted with ions by means of an ion implanter with 3.5°–3.5° offset according to the invention that utilizes digital scan.
Figure 15B:
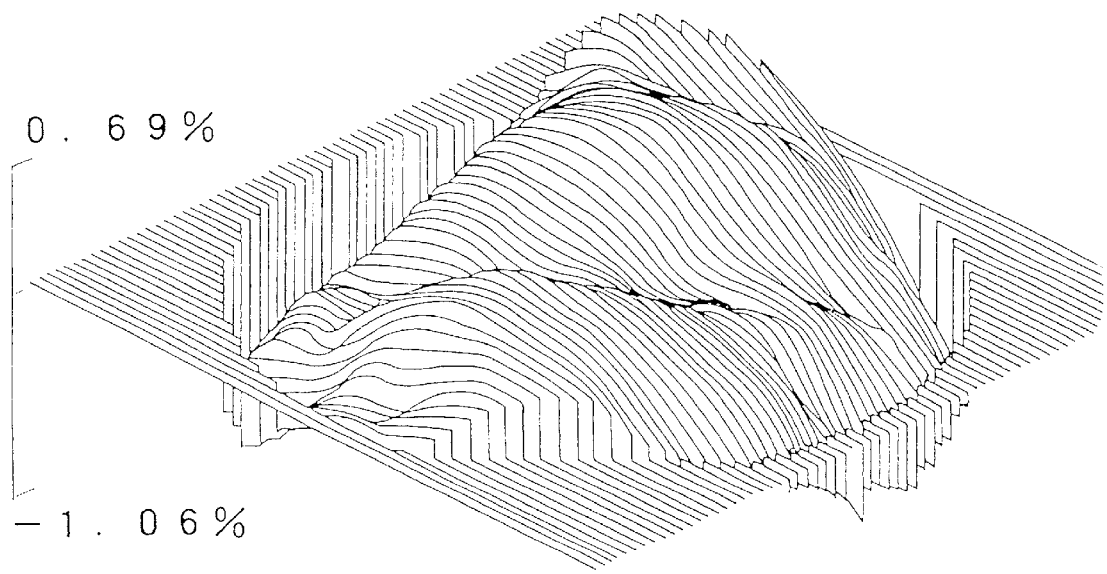
FIG. 15B is a schematic perspective view of the sheet resistance distribution shown in FIG. 15A.

FIGS. 14A, B and 15A, B respectively illustrate a sheet resistance inversely proportional to a dose distribution obtained when the digital scanning operation is not performed and a dose distribution obtained when the operation is digitally corrected. FIGS. 14A and 14B show the outcome of a measurement of the dose distribution on an 8-inch wafer when ions are implanted at a rate of $10^{14}$ per 1 $cm^2$ by applying a 100 KeVB+. The contours of dose distribution do not significantly differ from the calculated corresponding values obtained by means of the equation (20). On the other hand, FIGS. 15A and 15B show the dose distribution on an 8-inch wafer obtained when the operation of ion implantation is digitally controlled. The ion distribution is excellent in that the mean deviation is 0.45%. Here, it should be appreciated that these figures show the sheet resistance distribution measured by four probe-method and the sheet resistance is inversely proportional to the dose density at the portion measured.

As described above in detail, a parallel scan type ion implanter according to the invention is so designed as to hold the rate of raising or lowering the deflection voltage stepwise along the vertical direction (Y-direction) constant and the rate of changing the deflection voltage along the horizontal direction (X-direction) normalized by that of changing the deflecting the electric field at the center of the substrate with the rate of changing the voltage for raster deflection with time is varied as a function of the location of the beam spot on the substrate. With such an arrangement, the speed with which the moving speed of the beam spot on the substrate to form a raster is held constant regardless of the location on the substrate to produce an even and uniform dose distribution over the entire area of the substrate.

In the most of the practical systems prepared in accordance with the present invention, the coefficients of normalized digital scan function $F(X_W,Y_W)$ which is same as normalized dose function $F_N(X_W,Y_W)$ are not strictly equal to the calculated value obtained from the equation (20). Thus, actually the coefficients are determined by means of a least square method based on the datum obtained by a four terminal method with the wafer implanted without any digital scan. In reality, the function form of a dose distribution which expresses a group of ellipses holds every trial to hit the center lines of dose distribution of the acually implanted wafers. So the coeffcients of function are determined by the least square method taking into account of dose distribution function as the form $$D(X, Y)=1+\lambda_1 X+\lambda_2 Y+\lambda_3 X^2+\lambda_4 Y^2.$$

We claim:

1. A parallel scan type ion implanter designed to operate to analyze and sort out a pure ion beam from a beam produced by an ion source and to implant a substrate, said implanter comprising:

means for producing a focused ion beam,
   a first multipole electrostatic deflector, into which the focused ion beam is introduced with an incident angle equal to a half of a given offset deflection angle relative to the central axis of the deflector, for deflecting the ion beam further by an offset angle substantially equal to a half of the given offset deflection angle relative to the central axis of the first multipole electrostatic deflector and for rasterwise deflecting the ion beam around the axis of the offset deflected ion beam, said first deflector having a length $L_1$, and
   a second multipole electrostatic deflector, having a configuration geometrically similar to that of the first multipole electrostatic deflector, for rasterwise deflecting the ion beam back in order to sweep the ion beam and make the ion beam strike a substrate always with the same incident angle, said second deflector having a length $L_2$, the distance between the center of the outlet port of the second deflector and the substrate is $L_D$ and the distance between said first and second deflectors is $L$,
   wherein $L_1$, $L_2$, $L_D$, and $L$ are determined so as to minimize a constant C relating to a variation in a dose distribution, said dose distribution being obtained from a dose function ti $D(X, Y)=1+\lambda_1 X+\lambda_2 Y+\lambda_3 X^2+\lambda_4 Y^2,$ where $$\lambda_1 = 0,$$

$$\lambda_2 = \tan\alpha \frac{3 + \frac{3((L_2/2)+L_D)}{(L_1/2)+L+(L_2/2)}}{(L_1/2)+L+(L_2/2)}$$

$$\lambda_3 = \frac{4((L_2/2)+L_D)}{((L_1/2)+L+(L_2/2))^3 \cos^2\alpha}$$

$$\lambda_4 = \frac{4((L_2/2)+L_D)}{((L_1/2)+L+(L_2/2))^3}$$

where the rate of changing the deflection voltage stepwise in the vertical direction (Y-direction) of the substrate and the rate of changing the deflection voltage in the horizontal direction (X-direction) of the substrate are constant and a dose is equal to 1 at the time the beam spot passes the center of the substrate,
and where $$C = \frac{\sqrt{[(1/4(\lambda_1^2+\lambda_2^2)+1/16((\lambda_3^2+\lambda_4^2)-1/24(\lambda_3 \times \lambda_4))r_1^2]} \times r_1^2}{(1+1/4(\lambda_3+\lambda_4)r_1^2}$$

where $r_1$ is an outer diameter of the substrate.

2. A parallel scan type ion implanter designed to operate to analyze and sort out a pure ion implanter designed to operate to analyze and sort out a pure ion beam from a beam produced by an ion source, said implanter including means for producing an focused ion beam, a first multipole electrostatic deflector, into which the focused ion beam is introduced with an incident angle equal to a half of a given offset deflection angle relative to the central axis of the deflector, for deflecting the ion beam further by an offset angle substantially equal to one half of the given offset deflection angle relative to the central axis of the first multipole electrostatic deflector and for rasterwise deflecting the ion beam around the axis of the deflected ion beam, and a second multipole electrostatic deflector having a configuration geometrically similar to that of the first multipole electrostatic deflector, for rasterwise deflecting the ion beam back in order to sweep the ion beam and make the ion beam strike a substrate always with the same incident angle,
   the ion implanter comprising a memory device for storing data for varying the rate of changing a rastering voltage which is calculated based on a, dose function $D(X, Y)=1+\lambda_1 X+\lambda_2 Y+\lambda_3 X^2+\lambda_4 Y^2$,
   where $$\lambda_1 = 0,$$

$$\lambda_2 = \tan\alpha 3 + \frac{3((L_2/2)+L_D)}{(L_1/2)+L+(L_2/2)}$$
$$\overline{(L_1/2)+L+(L_2/2)}$$

$$\lambda_3 = \frac{4((L_2/2)+L_D)}{((L_1/2)+L+(L_2/2))^3 \cos^2\alpha}$$

$$\lambda_4 = \frac{4((L_2/2)+L_D)}{((L_1/2)+L+(L_2/2))^3}$$

$L_1$ and $L_2$ are respectively the length of said first multipole electrostatic deflector and that of the second multipole electrostatic deflector,
   $L_D$ is the distance between the center of the outlet port of the second multipole electrostatic deflector and the substrate, and
   L is the distance between the first and second multipole electrostatic deflectors, a D/A converter for converting a set of data on the rate of changing the rastering voltage stored in the memory device into an analog voltage signal, a voltage/frequency converter for converting the analog signal into a frequency signal, an up-down counter for counting the number of frequency signals obtained by the voltage/frequency converter and producing data at normalized coordinates and a device for generating signal source voltages to be respectively applied to the first and second multipole electrostatic deflectors on the basis of the data at the normalized coordinates.

3. A parallel scan type ion implanter for producing an even and uniform dose distribution on the entire surface area of a substrate by maintaining a constant moving speed of an ion beam spot produced by the implanter and directed onto the substrate, said implanter comprising:

first and second multipole electrostatic deflectors controlled by deflection voltages applied thereto, wherein said first and second deflectors have lengths $L_1$ and $L_2$, respectively, and are separated by a distance L, and the distance between the outlet port of said second deflector and the substrate is $L_D$; and control means for holding constant the rate of changing the applied deflection voltage stepwise along the vertical direction (Y-direction) and for varying the rate of changing the applied deflection voltage stepwise along the horizontal direction (X-direction) as a function of the location of the ion beam spot on the substrate, based upon said lengths $L_1$ and $L_2$ and said distances L and $L_D$, said rate of changing the deflection voltage along the horizontal direction being normalized with respect to value of the rate of changing the deflection voltage at the time the ion beam spot passes the center of the substrate.

4. A method for producing an even and uniform dose distribution on the entire surface area of a substrate by maintaining a constant moving speed of an ion beam spot produced by a parallel scan type ion implanter and directed onto the substrate, said method comprising:

providing first and second multipole electrostatic deflectors controlled by deflection voltages applied thereto, wherein said first and second deflectors have lengths $L_1$ and $L_2$, respectively, and are separated by a distance L, and the distance between the outlet port of said second deflector and the substrate is $L_D$;

holding constant the rate of changing the deflection voltage stepwise along the vertical direction (Y-direction); and varying the rate of changing the deflection voltage stepwise along the horizontal direction (X-direction) as a function of the location of the ion beam spot on the substrate based upon said lengths $L_1$ and $L_2$ and said distances L and $L_D$, said rate of changing the deflection voltage along the horizontal direction being normalized with respect to the rate of changing the deflection voltage at the time the ion beam spot passes the center of the substrate.

* * * * *